United States Patent
Ueno

(10) Patent No.: US 8,614,893 B2
(45) Date of Patent: Dec. 24, 2013

(54) INFORMATION PROCESSING APPARATUS AND INFORMATION PROCESSING APPARATUS HOLDER OPERATION METHOD

(75) Inventor: Tomohiro Ueno, Tokyo (JP)

(73) Assignee: NEC Corporation, Tokyo (JP)

( * ) Notice: Subject to any disclaimer, the term of this patent is extended or adjusted under 35 U.S.C. 154(b) by 445 days.

(21) Appl. No.: 13/078,424

(22) Filed: Apr. 1, 2011

(65) Prior Publication Data

US 2011/0248610 A1    Oct. 13, 2011

(30) Foreign Application Priority Data

Apr. 8, 2010   (JP) .................................. 2010-089537

(51) Int. Cl.
*H05K 7/20* (2006.01)

(52) U.S. Cl.
USPC .................. 361/695; 361/679.48; 361/679.49; 361/694; 361/715; 361/727; 165/80.3; 165/104.33; 165/121; 165/122; 454/184

(58) Field of Classification Search
USPC ............. 361/679.02, 679.32, 679.33, 679.37, 361/679.39, 679.46–679.5, 690–697, 361/715–728; 165/80.3, 104.33, 121–127, 165/185; 312/223.2, 236, 244; 454/184; 415/213.1, 214.1, 216.1, 178; 416/247 R, 146 R, 244 R, 69, 70 R; 248/27.1

See application file for complete search history.

(56) References Cited

U.S. PATENT DOCUMENTS

| | | | | |
|---|---|---|---|---|
| 5,562,410 A | * | 10/1996 | Sachs et al. ................. | 415/213.1 |
| 6,031,719 A | * | 2/2000 | Schmitt et al. ................ | 361/695 |
| 6,186,889 B1 | * | 2/2001 | Byrne ............................ | 454/184 |
| 6,317,320 B1 | * | 11/2001 | Cosley et al. ................. | 361/695 |
| 6,392,893 B1 | * | 5/2002 | Carney et al. ................. | 361/727 |
| 6,414,845 B2 | * | 7/2002 | Bonet ............................ | 361/695 |
| 6,504,716 B2 | * | 1/2003 | Huang et al. .................. | 361/695 |
| 6,714,411 B2 | * | 3/2004 | Thompson et al. ........... | 361/695 |
| 6,865,078 B1 | * | 3/2005 | Chang ............................ | 361/695 |
| 7,009,841 B2 | * | 3/2006 | Chen et al. .................... | 361/695 |
| 7,054,155 B1 | * | 5/2006 | Mease et al. .................. | 361/695 |
| 7,352,574 B2 | * | 4/2008 | Chen ............................. | 361/695 |
| 7,408,772 B2 | * | 8/2008 | Grady et al. ............. | 361/679.48 |
| 7,515,413 B1 | * | 4/2009 | Curtis ............................ | 361/695 |
| 7,530,890 B2 | * | 5/2009 | Chen ............................. | 454/184 |
| 7,558,061 B2 | * | 7/2009 | Franz et al. ................... | 361/695 |
| 7,623,344 B2 | * | 11/2009 | Beall et al. ............. | 361/679.48 |
| 8,425,286 B2 | * | 4/2013 | Coster et al. .................. | 454/184 |
| 8,472,185 B2 | * | 6/2013 | Wu et al. ................. | 361/679.54 |
| 2002/0067277 A1 | * | 6/2002 | Nishimura et al. ........... | 340/635 |
| 2004/0256334 A1 | * | 12/2004 | Chen ............................ | 211/41.17 |
| 2005/0254210 A1 | * | 11/2005 | Grady et al. .................. | 361/695 |

FOREIGN PATENT DOCUMENTS

JP   408322201 A   * 12/1996   ............... H02K 9/04
JP   2009117629 A      5/2009

* cited by examiner

*Primary Examiner* — Michail V Datskovskiy

(57) ABSTRACT

An information processing apparatus allows an operator to extract temperature adjustment electrical components accommodated in two holders through a single extraction port when changing the temperature adjustment electrical components. A second holder shares a transfer pathway between an accommodation position of a first holder and an opening portion of a chassis. When the second holder moves in the direction of the opening portion, the first holder is accordingly pushed and moved. Next, the first holder is fixed to a rotating member and is moved to a position above the chassis. After the second holder is discharged to the outside of the chassis, the first holder is returned to the original position.

10 Claims, 16 Drawing Sheets

(INFORMATION PROCESSING APPARATUS HOLDER OPERATION METHOD)

INFORMATION PROCESSING APPARATUS AND INFORMATION PROCESSING APPARATUS HOLDER OPERATION METHOD

REFERENCE TO RELATED APPLICATION

This application is based upon and claims the benefit of the priority of Japanese patent application No. 2010-089537, filed on Apr. 8, 2010, the disclosure of which is incorporated herein in its entirety by reference thereto.

TECHNICAL FIELD

The present disclosure relates to an information processing apparatus including a holder that accommodates an electrical component and to an information processing apparatus holder operation method, the information processing apparatus being suitable when the holder is temporarily extracted to the outside, the electrical component is changed, repaired, or inspected, and the holder is returned to an original position.

BACKGROUND

With the recent size reduction and performance improvement of an information processing apparatus such as a communication device or a server, the heat value per volume of such apparatus is increasing. Thus, for some information processing apparatuses, the need to cool the air therein with cooling fans is increasing. However, as with any other electronic components, these cooling fans are not free of malfunctions. Occasionally, when a cooling fan of an information processing apparatus malfunctions, the cooling fan is changed while the apparatus is in operation.

FIG. 14 illustrates a redundant configuration of cooling fans according to a first related technique. According to this first related technique, a plurality of cooling fans $101_1$ and $101_2$ are arranged in a single holder 102 arranged on one side in a chassis $100_1$ of an information processing apparatus. Thus, according to the first related technique, when any one of the cooling fans $101_1$ and $101_2$ malfunctions, an operator extracts the holder 102 through the front face of the chassis $100_1$ of the information processing apparatus in the direction of an arrow 103 and changes the malfunctioning one of the cooling fans $101_1$ and $101_2$.

In FIG. 14, the cooling fans $101_1$ and $101_2$ are fixed in the single holder 102. Thus, even when only one of the cooling fans $101_1$ and $101_2$ malfunctions, both the cooling fans $101_1$ and $101_2$ held in the holder 102 are extracted.

Normally, it takes at least a few minutes from extraction of a malfunctioning cooling fan 101 to installation of a new cooling fan. Thus, a certain volume of air flow for radiation needs to be ensured during change of a cooling fan. However, the first related technique fails to ensure such air flow. Namely, when the operator is changing a malfunctioning one of the cooling fans $101_1$ and $101_2$ and installing the holder 102 into the chassis $100_1$, the temperature in the chassis $100_1$ is increased. As a result, abnormal operations may be brought about in the information processing apparatus.

FIG. 15 illustrates a redundant configuration of cooling fans according to a second related technique. According to this second related technique, holders $112_1$ and $112_2$ are arranged on the near and far sides, respectively, on one side in the chassis $100_2$ of an information processing apparatus. The holders $112_1$ and $112_2$ accommodate cooling fans $111_1$ and $111_2$, respectively.

Thus, for example, when the cooling fan $111_1$ malfunctions, the operator extracts only the holder $112_1$ accommodating the cooling fan $111_1$ in the direction of an arrow 103 through the front side of the chassis $100_2$ of the information processing apparatus. The operator then changes the cooling fan $111_1$ accommodated in the holder $112_1$. During the change, the other holder $112_2$ remains at the original position in the chassis $100_2$ of the information processing apparatus. Thus, until the operator completes changing the cooling fan $111_1$, the cooling fan $111_2$ can execute a minimum air-cooling operation.

When the cooling fan $111_2$ malfunctions, the operator extracts only the holder $112_2$ accommodating the cooling fan $111_2$ in the direction of an arrow 113 through the rear side of the chassis $100_2$ of the information processing apparatus. During the change, the holder $112_1$ remains at the original position in the chassis $100_1$ of the information processing apparatus. Thus, until the operator completes changing the cooling fan $111_2$, the cooling fan $111_1$ can execute a minimum air-cooling operation.

FIG. 16 illustrates a redundant configuration of cooling fans according to a third related technique. According to this third related technique, holders $122_1$ and $122_2$ are arranged on both sides in a chassis $100_3$ of an information processing apparatus. One holder $122_1$ accommodates cooling fans $121_{11}$ and $121_{12}$, and the other holder $122_2$ accommodates cooling fans $121_{21}$ and $121_{22}$.

According to this third related technique, if the cooling fan(s) $121_{11}$ and/or $121_{12}$ accommodated in the holder $122_1$ malfunction(s), the operator extracts only the holder $122_1$ accommodating the cooling fans $121_{11}$ and $121_{12}$ in the direction of an arrow $103_1$ through the front side of the chassis $100_3$ of the information processing apparatus. The operator then changes the malfunctioning cooling fan(s) $121_{11}$ and/or $121_{12}$. During the change, the other holder $122_2$ remains at the original position in the chassis $100_3$ of the information processing apparatus. Thus, until the operator completes changing the cooling fan(s) $121_{11}$ and/or $121_{12}$, the cooling fan $121_{21}$ and $121_{22}$ can execute a minimum air-cooling operation in the chassis $100_3$.

Likewise, according to this third related technique, if the cooling fan(s) $121_{21}$ and/or $121_{22}$ accommodated in the holder $122_2$ malfunction(s), the operator extracts only the holder $122_2$ accommodating the cooling fans $121_{21}$ and $121_{22}$ in the direction of an arrow $103_2$ through the front side of the chassis $100_3$ of the information processing apparatus. The operator then changes the malfunctioning cooling fan(s) $121_{21}$ and/or $121_{22}$. During the change, the other holder $122_1$ remains at the original position in the chassis $100_3$ of the information processing apparatus. Thus, until the operator completes changing the cooling fan(s) $121_{21}$ and/or $121_{22}$ the cooling fan $121_{11}$ and $121_{12}$ can execute a minimum air-cooling operation in the chassis $100_3$.

Many information processing apparatuses such as servers are particularly required to have availability, that is, low fault incidence and high restoration speed in case of failure. Thus, even when one of the cooling fans malfunctions and needs to be changed, until the malfunctioning cooling fan is changed, a certain volume of air flow for radiation needs to be ensured by the other cooling fan(s). In this sense, since the second and third related techniques adopt a redundant configuration of cooling fans, even when the operator is changing a malfunctioning cooling fan, a minimum volume of air flow can be ensured. In practice, the operator changes cooling fans while checking for any abnormalities sequentially according to a procedure.

Thus, unlike the information processing apparatus adopting the first related technique, based on the information processing apparatuses adopting the second and third related techniques, a minimum volume of air flow can be ensured during change of a cooling fan. However, the second and third related techniques involve the following problems.

First, in the case of the second related technique, when changing the cooling fans $111_1$ and $111_2$, the operator needs to extract the two holders $112_1$ and $112_2$ in the two directions of the arrows 103 and 113 through the front and rear sides of the chassis $100_2$, respectively. Thus, the degree of installation freedom in the information processing apparatus is decreased. In recent years, installation density in information processing apparatuses is increasing, and in many cases, the operator can extract components only through the front or back side of the information processing apparatus. Thus, a decrease in the degree of installation freedom is a major obstacle to the introduction of information processing apparatuses.

In the case of the third related technique, the operator can extract the two holders $122_1$ and $122_2$ in the same direction. However, according to the third related technique, the holders $122_1$ and $122_2$ are arranged on the right and left sides in the chassis $100_3$, respectively. Thus, assuming that the total volume of the two holders $122_1$ and $122_2$ is equal to that of the two holders $112_1$ and $112_2$ according to the second related technique, the length of each of the cooling fans $121_{11}$, $121_{12}$, $121_{21}$, and $121_{22}$ in the direction of the rotating shaft thereof is half the length of the cooling fans $111_1$ and $111_2$ in the corresponding direction.

Normally, if a cooling fan, which is installed on one side in a chassis and used in a pull manner, is compared with two cooling fans, which have a width half that of the above cooling fan, are installed on both sides in a chassis, and are used in a push-pull manner, the latter two cooling fans generate a smaller volume of air flow. To equalize the volumes of air flow between the above two cases, it is necessary to provide a larger power to the latter two cooling fans. Namely, use of the third related technique causes a problem of decreasing cooling efficiency during a normal operation.

To solve the above problems, as a fourth related technique, for example, Patent Document 1 discloses an apparatus including a sleeve that is slightly smaller than an opening portion of the chassis. A cooling fan holder that can be freely inserted into or extracted from the sleeve is arranged. According to this fourth related technique, when the operator pulls the holder accommodating a plurality of cooling fans from the chassis, the sleeve is also pulled. The holder is pulled within a range in which the holder does not fall out of this sleeve.

The holder includes cells each accommodating a cooling fan as a unit. The operator pulls the holder from the sleeve to a limit position, and among these units, the operator lifts up an arbitrary unit to be changed. In this way, the operator can change a malfunctioning cooling fan. While changing a cooling fan, the operator can allow the other cooling fans to operate. Thus, because of this sleeve, the air in the chassis can be cooled as normal.

[Patent Document 1]
Japanese Patent Kokai Publication No. JP2009-117629A (paragraphs 0043 to 0046 and FIGS. 3, 4, and 7)

SUMMARY

The entire disclosure of the above mentioned Patent Document 1 is incorporated herein by reference thereto. The following analyses are presented according to the views of the present disclosure.

According to this fourth related technique, when the holder is pulled from the sleeve to the limit position, the extraction port of each cooling fan unit in the holder is open upward. Each cooling fan unit includes two through-holes in the upper portion thereof. The operator inserts his/her fingers into these through-holes to extract a desired unit.

Thus, according to the fourth related technique, the holder cannot be extracted to a desired position outside the chassis. Therefore, since each cooling fan unit needs to specially include two through-holes, the cost is increased, counted as a problem. In addition, when the operator inserts his/her fingers into the two through-holes in a unit, the fingers must not come in contact with blade portions of the cooling fan. Thus, the through-hole portions need to be arranged at a certain distance away from the cooling fan body. As a result, if the fourth related technique is used, the size of the chassis accommodating the cooling fans is increased or only small-sized cooling fans can be used, counted as a problem.

The above description has so far illustrated information processing apparatuses that include air-cooling fans and problems that arise when the air-cooling fans are changed. However, there are information processing apparatuses using Peltier devices to execute similar cooling and information processing apparatuses using heating elements to increase the temperature to a certain level. If such information processing apparatuses include a holder accommodating these electrical components, when the operator needs to change these electrical components as necessary, similar problems arise.

Thus, it is an object of the present disclosure to provide an information processing apparatus and an information processing apparatus holder operation method allowing an operator to extract temperature adjustment electrical components accommodated in two holders through a single extraction port when changing the temperature adjustment electrical components.

It is another object of the present disclosure to provide an information processing apparatus and an information processing apparatus holder operation method sufficiently preventing change of the temperature in the chassis when changing the electrical components, while ensuring the degree of freedom in the installation of the holder in the apparatus.

According to a first aspect of the present disclosure, there is provided an information processing apparatus comprising:

a chassis being shaped into a rectangular parallelepiped having six faces of a top face, a bottom face, a first pair of opposing side faces, and a second pair of opposing side faces and including an opening portion in a certain one of the first pair of opposing side faces;

a first holder being arranged at a first accommodation position in the chassis and holding a predetermined electrical component that freely reciprocates on a first transfer pathway connecting the first accommodation position and the opening portion;

a second holder including the first transfer pathway in the chassis, being arranged at a second accommodation position farther than the first accommodation position from the opening portion, and holding a predetermined electrical component that freely reciprocates on a second transfer pathway connecting the second accommodation position and the opening portion;

a rotating member being rotatable around a certain point at an upper end portion of the opening portion in a plane parallel to a certain one of the second pair of opposing side faces from a first rotational position at which the entire rotating member is accommodated in the chassis to a second rotational position which the rotating member reaches when the rotating member is rotated by a certain angle of 90 degrees or more;

a first-holder/rotating-member fixing unit fixing the first holder to the rotating member remaining stationary at the first rotational position, when the first holder is moved from the first accommodation position to a predetermined position that the first holder reaches before completely passing through the opening portion; and a releasing unit releasing, under a predetermined condition, the first holder and the rotating member secured by the first-holder/rotating-member fixing unit.

According to a second aspect of the present disclosure, there is provided an information processing apparatus holder operation method, comprising:

"second holder pulling", i.e., pulling a second holder toward an opening portion with a handle attached to the second holder, the first holder being arranged at a first accommodation position in a chassis that is shaped into a rectangular parallelepiped having six faces of a top face, a bottom face, a first pair of opposing side faces, and a second pair of opposing side faces and that includes the opening portion in a certain one of the first pair of opposing side faces, the first holder holding a predetermined electrical component that freely reciprocates on a first transfer pathway connecting the first accommodation position and the opening portion, and the second holder being arranged at a second accommodation position farther than the first accommodation position from the opening portion and holding a predetermined electrical component that freely reciprocates on a second transfer pathway connecting the second accommodation position and the opening portion;

"first-holder/rotating-member fixing", i.e., fixing the first holder to a rotating member remaining stationary at a first rotational position, when the second holder pushes the back of the first holder and moves toward the opening portion and when the first holder is moved from the first accommodation position to a predetermined position that the first holder reaches before completely passing through the opening portion in the second holder pulling, the rotating member being rotatable around a certain point at an upper end portion of the opening portion in a plane parallel to a certain one of the second pair of opposing side faces from the first rotational position at which the entire rotating member is accommodated in the chassis to a second rotational position which the rotating member reaches when the rotating member is rotated by a certain angle of 90 degrees or more;

"opening portion opening" i.e., continuously pulling the second holder toward the opening portion with the handle after the first holder is fixed to the rotating member in the first-holder/rotating-member fixing, allowing accordingly generated force to push the back of the first holder and to rotate the rotating member, allowing the first holder fixed to the rotating member to pass through the opening portion, allowing the first holder to rotationally move to a position above the chassis, and opening the opening portion;

"second holder discharge", i.e., continuously pulling the second holder with the handle, allowing the second holder to pass through the opening portion opened in the opening portion opening, and discharging the second holder to the outside of the chassis; and "first accommodation position return", i.e., allowing the weight of the first holder to rotate the first holder in a direction opposite to the direction in which the rotating member is rotated and moving the first holder toward the first accommodation position, after the second holder is discharged to the outside of the chassis in the second holder discharge and the force pressing the back of the first holder is eliminated.

The meritorious effects of the present disclosure include as follows. As described above, according to the present disclosure, the first and second holders are arranged so that the transfer pathway of the second holder includes that of the first holder in the chassis. Thus, the operator can extract only the first holder to the outside of the chassis, and in addition, when extracting the second holder, the operator can extract the first holder in conjunction with the second holder. As a result, working time can be shortened. In addition, when the operator extracts the second holder to the outside of the chassis, the first holder is fixed to the rotating member, pushed by the second holder, and rotationally moved to a position above the chassis. Thus, when the second holder is extracted, because of its own weight, the first holder can reversely rotate the rotating member and can move toward the original position in the chassis. Consequently, time during which neither the first holder nor the second holder exists in the chassis can be minimized.

Thus, according to the present disclosure, since the operator can extract not only the first holder but also the second holder to the outside of the chassis, the shape of the electrical components is not particularly limited, compared with electrical components partly pulled from the chassis when changed. In addition, while one holder is being extracted to the outside of the chassis, the other holder can be loaded into the chassis. Thus, the present disclosure is sufficiently applicable not only to change of electrical components but also to a quick repair or inspection.

PREFERRED MODES

In the following description of the preferred modes, reference to symbols shown in the figures are presented merely for helping better understanding and not intended to be limitative to the modes illustrated by the figures.

Figure 1:
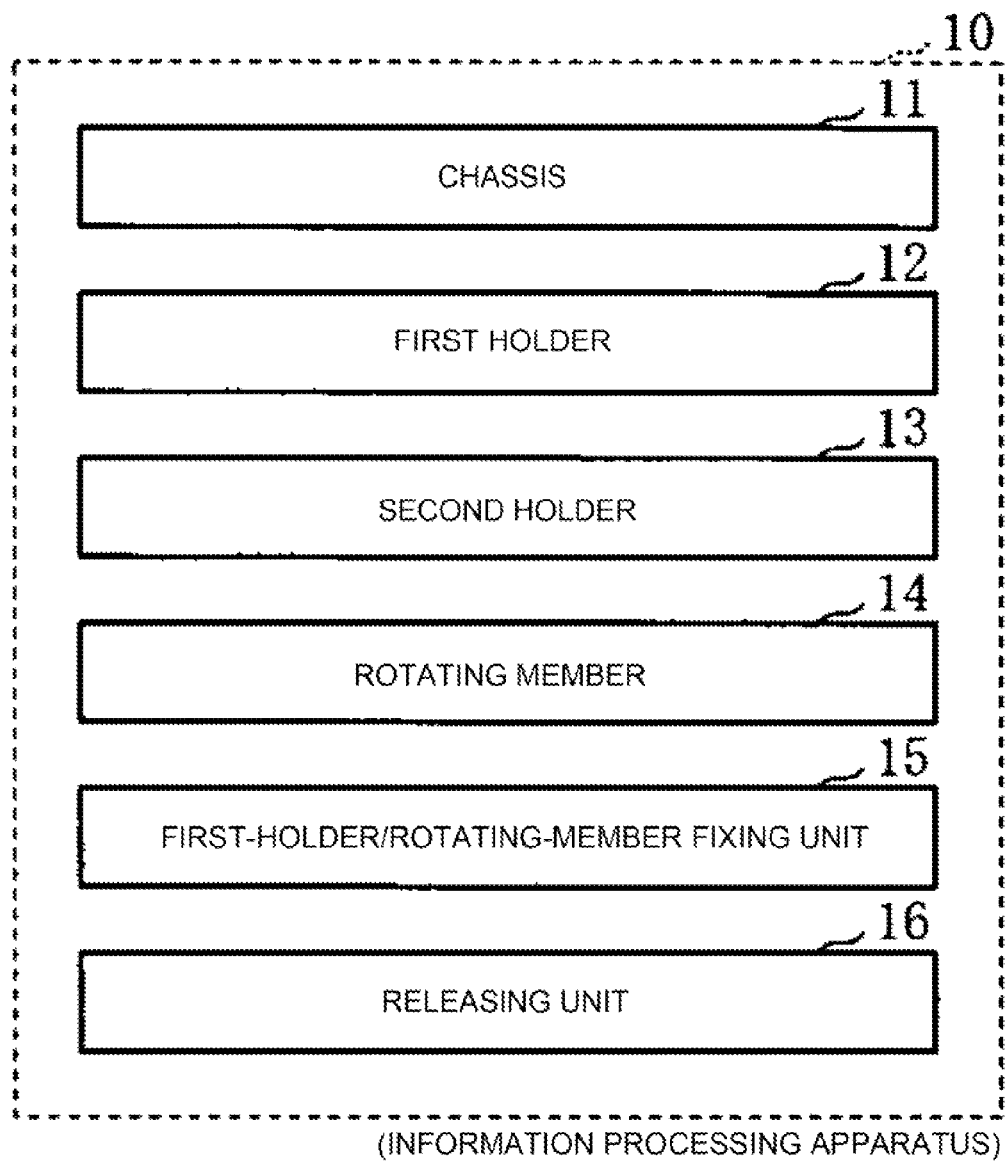
FIG. 1 is a diagram schematically showing the components or elements corresponding to an information processing apparatus according to a preferred mode of disclosure.

FIG. 1 is a diagram schematically showing the components or elements corresponding to an information processing apparatus 10 according to a preferred mode of the present disclosure. The information processing apparatus 10 according to the present disclosure includes a chassis 11, a first holder 12, a second holder 13, a rotating (swinging) member 14, a first-holder/rotating-member fixing unit (fixing unit between first holder and rotating member) 15, and an releasing unit 16. The chassis 11 is shaped into a rectangular parallelepiped having six faces of a top face, a bottom face, a first pair of opposing side faces, and a second pair of opposing side faces and includes an opening portion in a certain one of the first pair of opposing side faces. The first holder 12 is arranged at a first accommodation position in the chassis 11 and holds a predetermined electrical component that freely reciprocates on a first transfer pathway connecting the first accommodation position and the opening portion. The second holder 13 includes the first transfer pathway in the chassis 11, is arranged at a second accommodation position farther than the first accommodation position from the opening portion, and holds a predetermined electrical component that freely reciprocates on a second transfer pathway connecting the second accommodation position and the opening portion. The rotating member 14 is rotatable (pivotable) about a certain point at an upper end portion of the opening portion in a plane parallel to a certain one of the second pair of opposing side faces. This rotating member 14 is rotatable from a first rotational position at which the entire rotating member 14 is accommodated in the chassis 11 to a second rotational position which the rotating member 14 reaches when the rotating member 14 is rotated by a certain angle of 90 degrees or more. The first-holder/rotating-member fixing unit 15 fixes the first holder 12 to the rotating member 14 remaining stationary at the first rotational position, when the first holder 12 is moved from the first accommodation position to a predetermined position that the first holder reaches before completely passing through the opening portion. The releasing unit 16 unfixes, under a predetermined condition, the first holder 12 and the rotating member 14 secured by the first-holder/rotating-member fixing unit 15.

Figure 2:
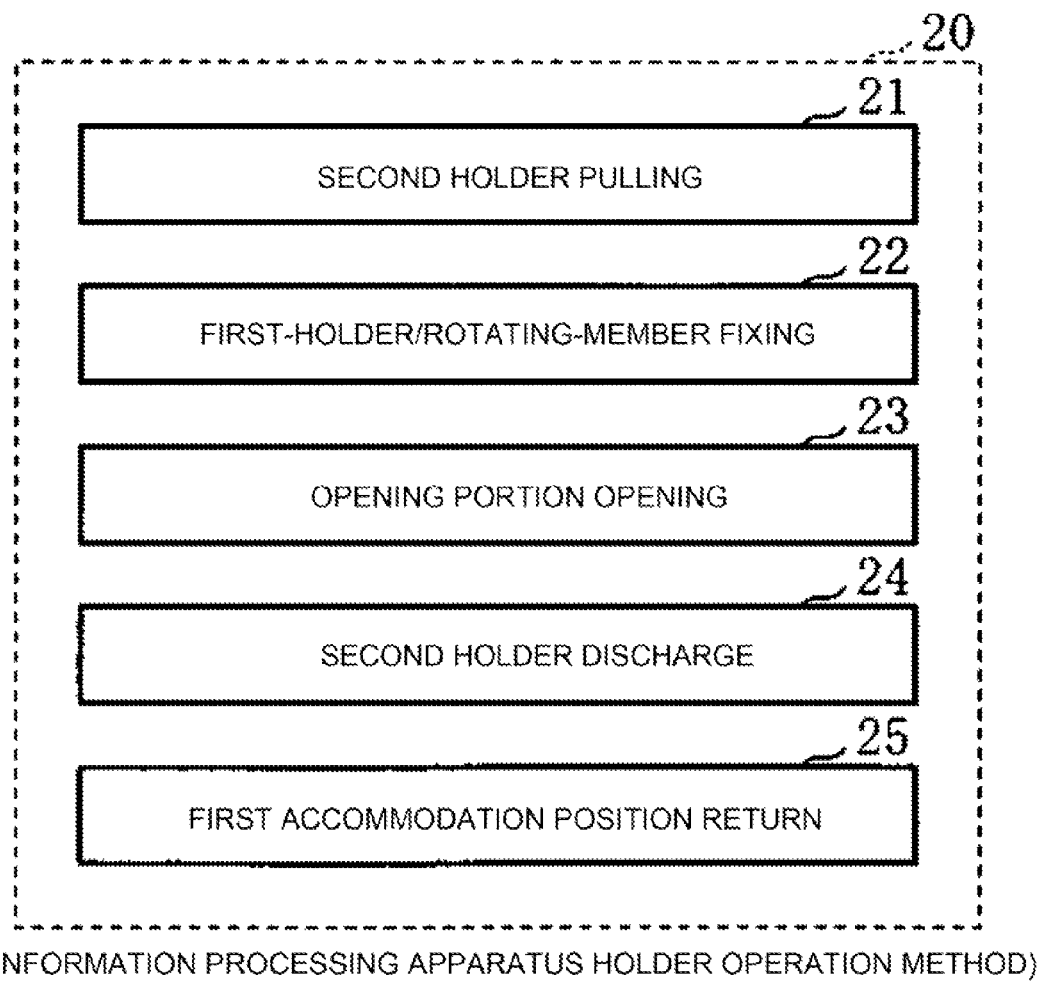
FIG. 2 is a diagram corresponding to an information processing apparatus holder operation method claimed by the present disclosure.

FIG. 2 is a diagram corresponding to an information processing apparatus holder operation method 20 according to the second aspect of the present disclosure. The information processing apparatus holder operation method 20 includes: second holder pulling 21, a first-holder/rotating-member fixing 22, opening portion opening 23, second holder discharge 24, and first accommodation position return 25. In the second holder pulling 21, a second holder is pulled toward an opening portion of a chassis with a handle attached to the second holder. The chassis is shaped into a rectangular parallelepiped having six faces of a top face, a bottom face, a first pair of opposing side faces, and a second pair of opposing side faces and includes the opening portion in a certain one of the first pair of opposing side faces. In this chassis, a first holder holding a predetermined electrical component is arranged at a first accommodation position. The first holder freely reciprocates on a first transfer pathway connecting the first accommodation position and the opening portion. In addition, the second holder holding a predetermined electrical component is arranged at a second accommodation position farther than the first accommodation position from the opening portion. The second holder freely reciprocates on a second transfer pathway connecting the second accommodation position and the opening portion. In the first-holder/rotating-member fixing 22, the first holder is secured to a rotating member, when the second holder pushes the back of the first holder and moves toward the opening portion and when the first holder is moved from the first accommodation position to a predetermined position that the first holder reaches before completely passing through the opening portion in the second holder pulling 21. The rotating member is rotatable around a certain point at an upper end portion of the opening portion in a plane parallel to a certain one of the second pair of opposing side faces from a first rotational position at which the entire rotating member is accommodated in the chassis to a second rotational position which the rotating member reaches when the rotating member is rotated by a certain angle of 90 degrees or more.

In the opening portion opening 23, after the first holder is fixed to the rotating member in the first-holder/rotating-member fixing 22, the second holder is pulled continuously toward the opening portion with the handle. By allowing accordingly generated force to push the back of the first holder and to rotate the rotating member, the first holder fixed to the rotating member is allowed to pass through the opening portion. By allowing the first holder to rotationally move to a position above the chassis, the opening portion is opened.

In the second holder discharge 24, the second holder is continuously pulled with the handle to pass through the opening portion opened in the opening portion opening 23. The second holder is then discharged to the outside of the chassis.

In the first accommodation position return 25, after the second holder is discharged to the outside of the chassis and the force pressing the back of the first holder is accordingly eliminated in the second holder discharge 24, the first holder is rotated by the weight thereof in a direction opposite to the direction in which the rotating member is rotated, and the first holder is then moved toward the first accommodation position.

In the following, preferred exemplary embodiments are presented.

First Exemplary Embodiment

Next, a first exemplary embodiment will be described.

Figure 3:
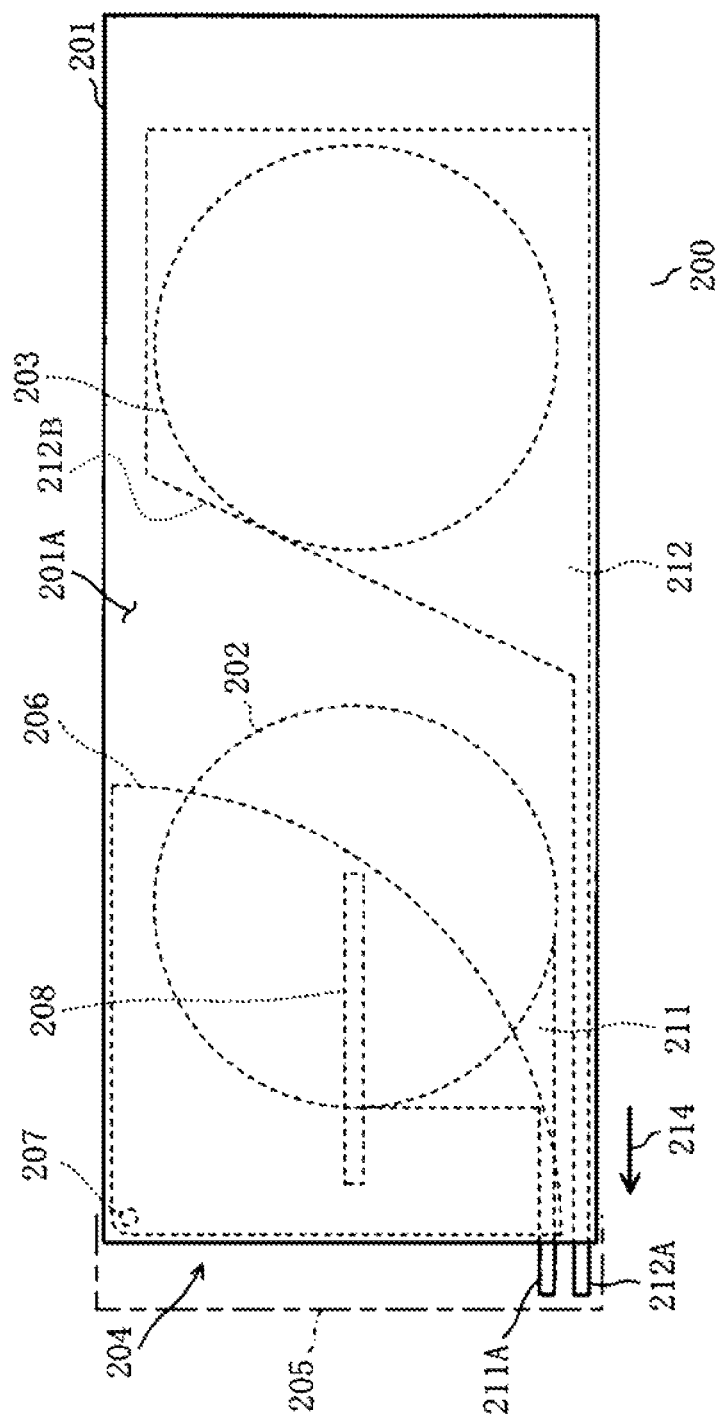
FIG. 3 is a side view of a main portion of the information processing apparatus using a plurality of cooling fans according to a first exemplary embodiment of the present disclosure.

FIG. 3 schematically illustrates a configuration of an information processing apparatus 200 using a plurality of cooling fans according to the first exemplary embodiment. A chassis 201 constituting the information processing apparatus 200 according to the present exemplary embodiment includes first and second cooling fans 202 and 203, respectively. In FIG. 3, the left end portion of the chassis 201 includes an opening portion 204. This opening portion 204 functions as a port through which the first and second cooling fans 202 and 203 are extracted. A front panel 205 can be attached to or detached from the opening portion 204 even when the information processing apparatus 200 is in operation.

Of course, depending on the configuration of the information processing apparatus 200, the opening portion 204 may be arranged in the back side thereof. In this case, a back panel (not illustrated) is detachably fitted to the opening portion 204.

The chassis 201 includes a side plate 201A on the proximate side in FIG. 3, and a rotating plate 206 is arranged on the inner side of the side plate 201A. The rotating plate 206 has the shape of a quadrant with a radius slightly shorter than the height of the opening portion 204. The rotating plate 206 is rotatable around a rotating shaft or axis (pivot axis) 207 arranged at an upper corner of the side plate 201A near the opening portion 204. Normally, the rotating plate 206 is secured at the position illustrated in FIG. 3 by a locking mechanism (not illustrated). In addition, the upper corner near the opening portion 204 is open, so that the rotating plate 206 can suitably rotate by about 180 degrees around the rotating shaft 207. Of course, when the front panel 205 is attached, this opening portion is shielded from the outside.

A single slide rail 208 is fixed on the inner face side of the rotating plate 206 of the chassis 201. When the rotating plate 206 is secured (positioned) at a position illustrated in FIG. 3 by the locking mechanism, the slide rail 208 is arranged horizontally as illustrated in FIG. 3.

The first and second cooling fans 202 and 203 are held by first and second cooling fan holders 211 and 212, respectively. The first and second cooling fan holders 211 and 212 include first and second handles 211A and 212A, respectively. These handles 211A and 212A are used to extract the first and second cooling fan holders 211 and 212 through the opening portion 204, respectively. An end portion of each of the first and second handles 211A and 212A slightly protrudes from the opening portion 204. If it is formulated adapted for the operator to extract the first and second cooling fan holders 211 and 212 to the outside of the chassis 201 by using a certain tool, the information processing apparatus 200 may not include the first and second handles 211A and 212A. It is preferred that the second cooling fan holder 212 has a sloped end 212B adapted to about the periphery of the first cooling fan 202 so as to urge the rotating member 206 to rotate when the second handle 212A is further pulled along the arrow 214.

Figure 4:
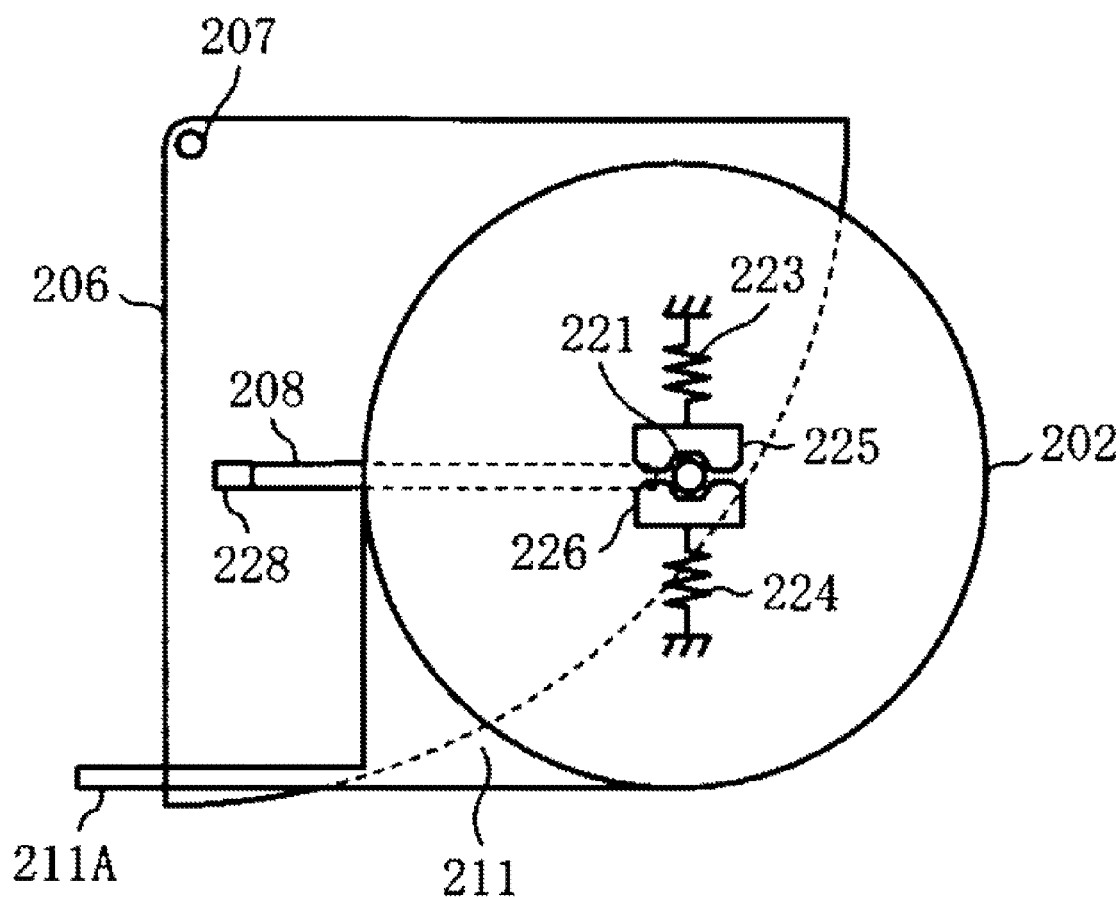
FIG. 4 is a side view illustrating a specific relationship between a slide rail of a rotating plate and a first cooling fan holder according to the first exemplary embodiment.

FIG. 4 illustrates a specific relationship between the slide rail 208 of the rotating plate 206 and the first cooling fan holder 211 according to the present exemplary embodiment. The slide rail 208 attached to the rotating plate 206 engages with a protrusion 221 that can reciprocate along the slide rail 208.

Figure 5:
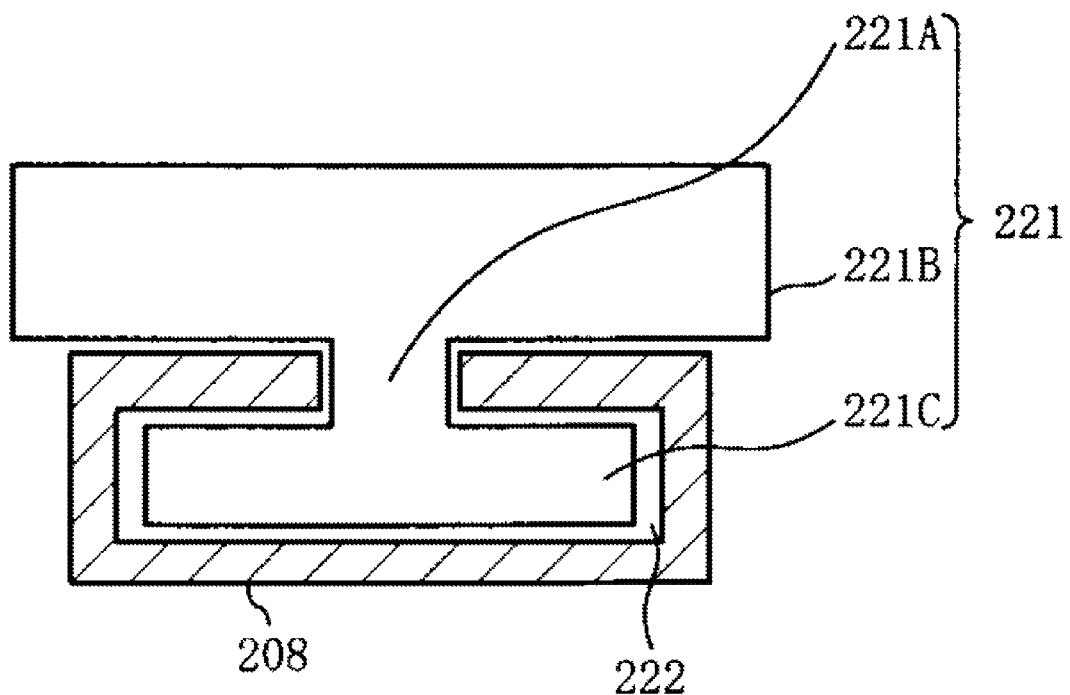
FIG. 5 is a sectional view illustrating an engagement state between the slide rail and a protrusion according to the first exemplary embodiment.

FIG. 5 illustrates an engagement state between the slide rail 208 and the protrusion 221. FIG. 5 is a cross-sectioned view of the engagement portion between the slide rail 208 and the protrusion 221, taken along a direction perpendicular to a longitudinal direction of the slide rail 208. The slide rail 208 has a C-shaped cross-section with four right-angle corners. The protrusion 221 is a metal component formed by a small-diameter column 221A and medium- and large-diameter circular plates 221C and 221B, respectively, which are located at both ends of the small-diameter column (stud) 221A. The column 221A and the plates 221C and 221B are concentrically formed. The medium-diameter circular plate 221C is loosely fitted into a recess (hollow part) 222 of the slide rail 208.

The recess 222 runs the entire length of the slide rail 208 in the longitudinal direction. The recess 222 at either end of the slide rail 208 is filled with a stop member (not illustrated), to prevent the protrusion 221 from falling out of the end after being fitted.

Referring back to FIG. 4, the first cooling fan holder 211 to which the first cooling fan 202 is attached includes: a pair of spring members 223 and 224; and a pair of pressing members 225 and 226 receiving force that presses each other from the pair of spring members 223 and 224. The pair of pressing members 225 and 226 sandwiches the circular plate 221B (FIG. 5) of the protrusion 221 protruding from the slide rail 208.

Thus, with the pair of pressing members 225 and 226 sandwiching the protrusion 221, the first cooling fan holder 211 can reciprocate along the slide rail 208 arranged on the rotating plate 206. A magnet 228 is attached to the left end portion of the slide rail 208 of the rotating plate 206 illustrated in FIG. 4.

Namely, when reaching the left end portion of the slide rail 208, the protrusion 221 is secured by this magnet 228. Thus, while the protrusion 221 is being secured by the magnet 228, the position of the first cooling fan holder 211 with respect to the rotating plate 206 is maintained by the pair of pressing members 225 and 226 sandwiching the protrusion 221.

On the other hand, if the first cooling fan holder 211 receives force in a direction opposite to the direction of an arrow 214, i.e., in a direction remote from the side at which the magnet 228 is disposed, the first cooling fan holder 211 can move in the direction along the slide rail 208. Even when the protrusion 221 is secured by the magnet 228, if the first cooling fan holder 211 receives force of a certain level or more in the direction of the arrow 214 in FIG. 3, the pair of pressing members 225 and 226 becomes unable to sandwich (retain) the protrusion 221. As a result, the first cooling fan holder 211 is extracted to the outside of the chassis 201 in FIG. 3, leaving the protrusion 221 on the slide rail 208.

As in FIG. 3, for simplicity, the following drawings referred to in the first exemplary embodiment will be simplified. In addition, FIG. 4 will be hereinafter referred to as needed.

<Change of First Cooling Fan 202>

As described with reference to FIGS. 3 and 4, since the first cooling fan holder 211 holding the first cooling fan 202 includes the pair of pressing members 225 and 226 engaging with the slide rail 208, the first cooling fan holder 211 freely reciprocates along the slide rail 208. Namely, when the first handle 211A is pulled in the direction of the arrow 214 in FIG. 3, the first cooling fan holder 211 alone can be moved in the direction of the arrow 214, with the second cooling fan holder 212 remaining stationary.

Figure 6:
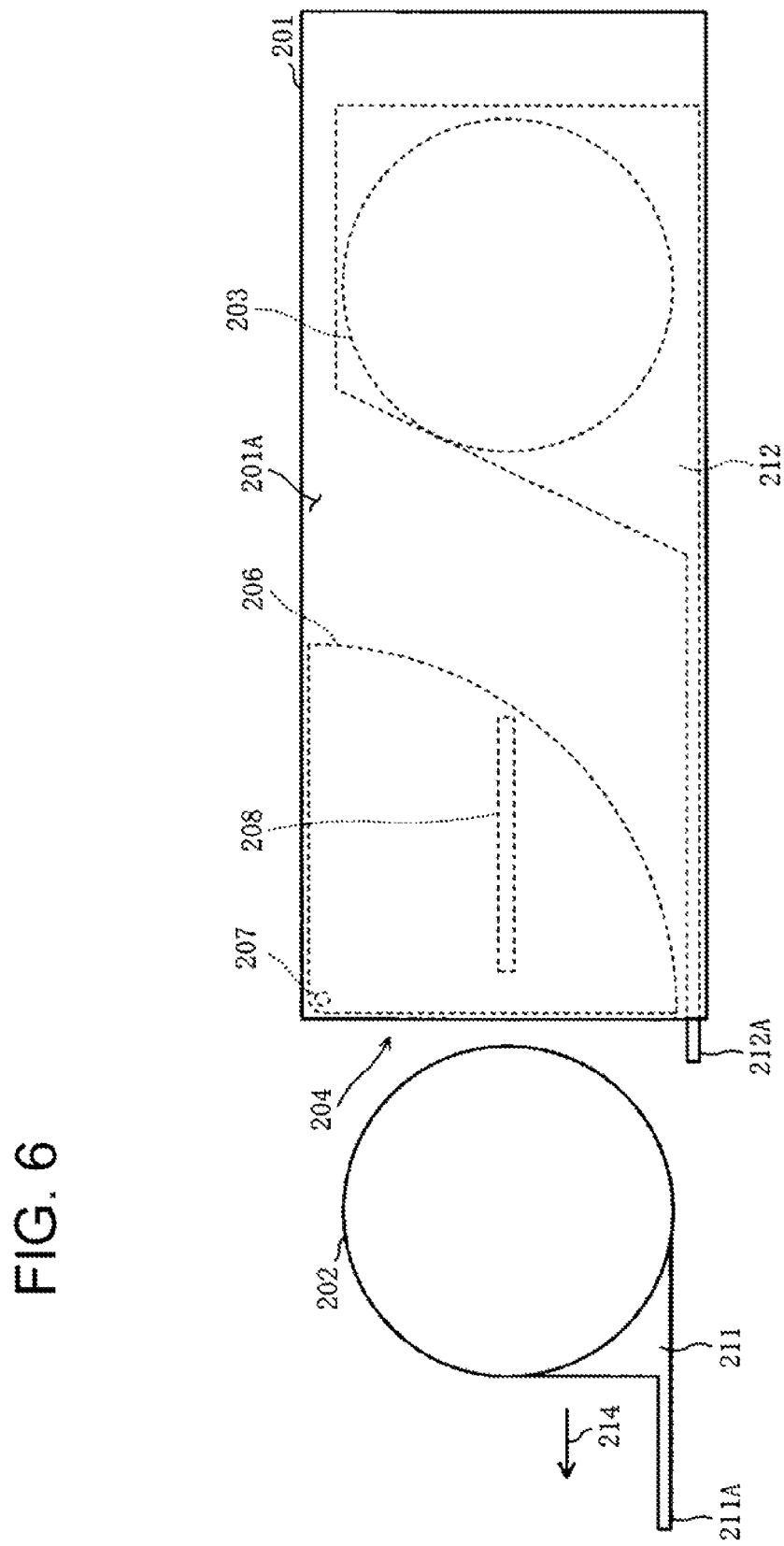
FIG. 6 is a side view of a main portion of the information processing apparatus according to the first exemplary embodiment with the first cooling fan holder extracted from the information processing apparatus.

FIG. 6 illustrates the first cooling fan holder 211 extracted from the information processing apparatus 200. FIG. 4 will also be referred to in the following description.

If the first handle 211A illustrated in FIG. 3 is pulled in the direction of the arrow 214, first, the first cooling fan holder 211 is moved along the slide rail 208. Next, when the protrusion 221 illustrated in FIG. 4 reaches the left end position of the slide rail 208 in FIG. 4, the movement is inhibited. In this state, if the operator pulls the first handle 211A with slightly greater force in the direction of the arrow 214, the pair of pressing members 225 and 226 illustrated in FIG. 4 and releases the protrusion 221 opposing (counteracting) the pressing force from the pair of spring members 223 and 224. Thus, since the first cooling fan holder 211 is released from the restriction of the slide rail 208 and is moved in the direction of the arrow 214, the first cooling fan holder 211 can be extracted to the outside of the information processing apparatus 200.

During this change of the first cooling fan holder 211, the second cooling fan holder 212 remains at the original position in the chassis 201. Thus, when the operator is changing the first cooling fan 202 attached to the first cooling fan holder 211, the second cooling fan 203 can continue an air-cooling operation.

When the operator completes changing the first cooling fan 202, it is only necessary that the operator insert the first cooling fan holder 211 into the chassis 201 through the opening portion 204 and push the first cooling fan holder 211 in the direction opposite to the direction of the arrow 214.

When the operator pushes the first cooling fan holder 211, first, the pair of pressing members 225 and 226 attached to the first cooling fan holder 211 comes into contact with the protrusion 221 secured (pulled) by the magnet 228 arranged at the left end portion of the slide rail 208. In this state, if the operator pushes the first cooling fan holder 211 with slightly greater force into the chassis 201, the pair of pressing members 225 and 226 acts against the pressing force from the pair of spring members 223 and 224. Accordingly, the pair of pressing members 225 and 226 is separated to form a gap for sandwiching the protrusion 221. Subsequently, the first cooling fan holder 211 is guided along the slide rail 208 and is returned to the home position illustrated in FIG. 3.

When the first cooling fan holder 211 is returned to the position illustrated in FIG. 3, a power supply cord connector (not illustrated) for driving the first cooling fan 202 is connected to a connector (not illustrated) on the information processing apparatus 200 side. Thus, as soon as the connection is established, rotation of the first cooling fan 202 is started.

Of course, the information processing apparatus may be configured so that, when the first cooling fan holder 211 is extracted to the outside of the information processing apparatus 200, the power supply cord is extracted along with the first cooling fan holder 211. In this way, after the connectors are connected and the rotation of the first cooling fan 202 is started, the first cooling fan holder 211 can be returned to the position illustrated in FIG. 3. Next, by attaching the front panel 205 illustrated in FIG. 3, the operator completes changing the first cooling fan 202.

<Change of Second Cooling Fan 203>

Next, change of the second cooling fan 203 according to the present exemplary embodiment will be described. The operator can change the second cooling fan 203 by simply pulling the second handle 212A illustrated in FIG. 3 in the direction of the arrow 214 and extracting the second cooling fan holder 212 from the chassis 201. The change of the second cooling fan 203 will be hereinafter described in detail.

Figure 7:
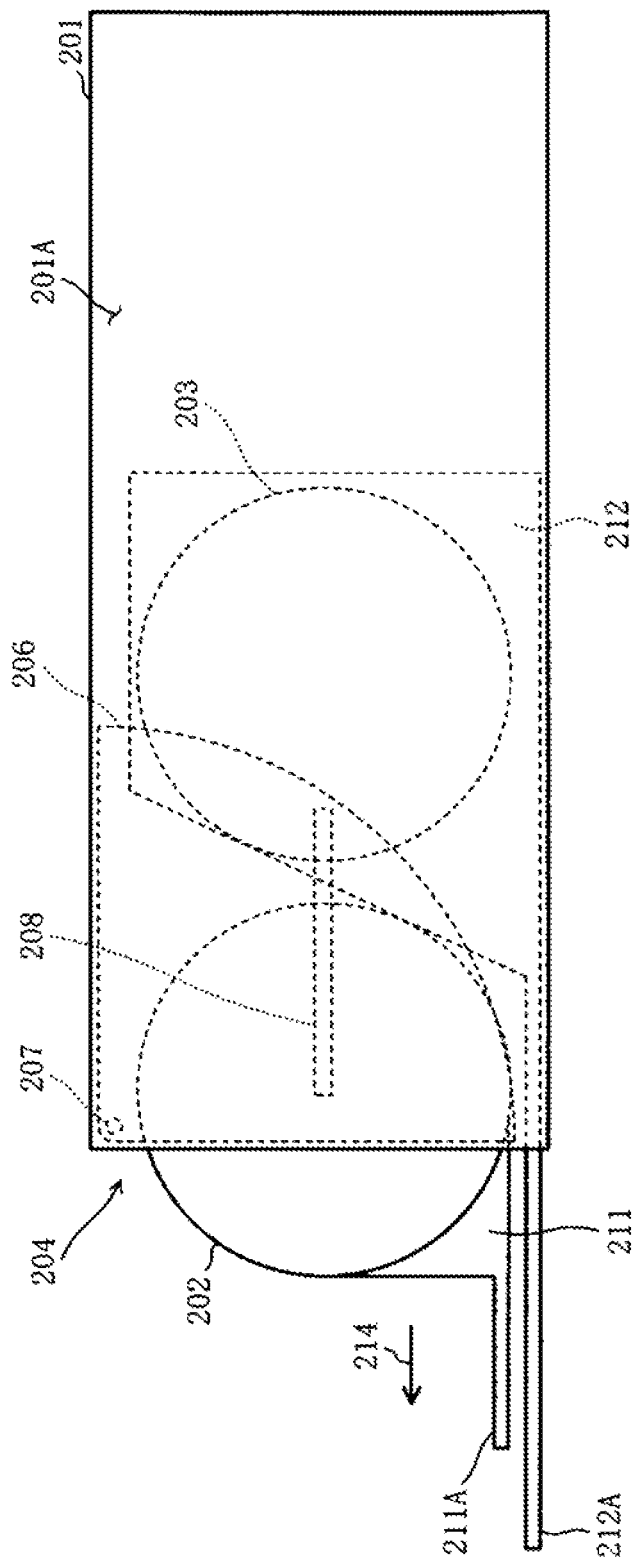
FIG. 7 is a side view of a main portion of the information processing apparatus with a second cooling fan holder partly extracted to the outside of the chassis from the position illustrated in FIG. 3.

FIG. 7 illustrates the second cooling fan holder 212 at a position slightly pulled toward the outside of the chassis 201 from the position illustrated in FIG. 3. If the operator pulls the second handle 212A in the direction of the arrow 214, since the second cooling fan holder 212 pushes the back (preferable back circular profile of the rotating plate 206) of the first cooling fan holder 211, the first cooling fan holder 211 is also moved in the direction of the arrow 214. Since the first cooling fan holder 211 is engaged with the slide rail 208, the first cooling fan holder 211 is moved along this slide rail 208 in the direction of the arrow 214.

As described above, when the first cooling fan holder 211 is moved to the position illustrated in FIG. 7, the protrusion 221 is moved to the left end position of the slide rail 208. Accordingly, the protrusion 221 is secured by the magnet 228. In this state, if the operator gently pulls the second handle 212A in the direction of the arrow 214, the front-end portion of the second cooling fan holder 212 pushes the rear-end portion of the first cooling fan holder 211, with the pair of pressing members 225 and 226 sandwiching the protrusion 221.

Figure 8:
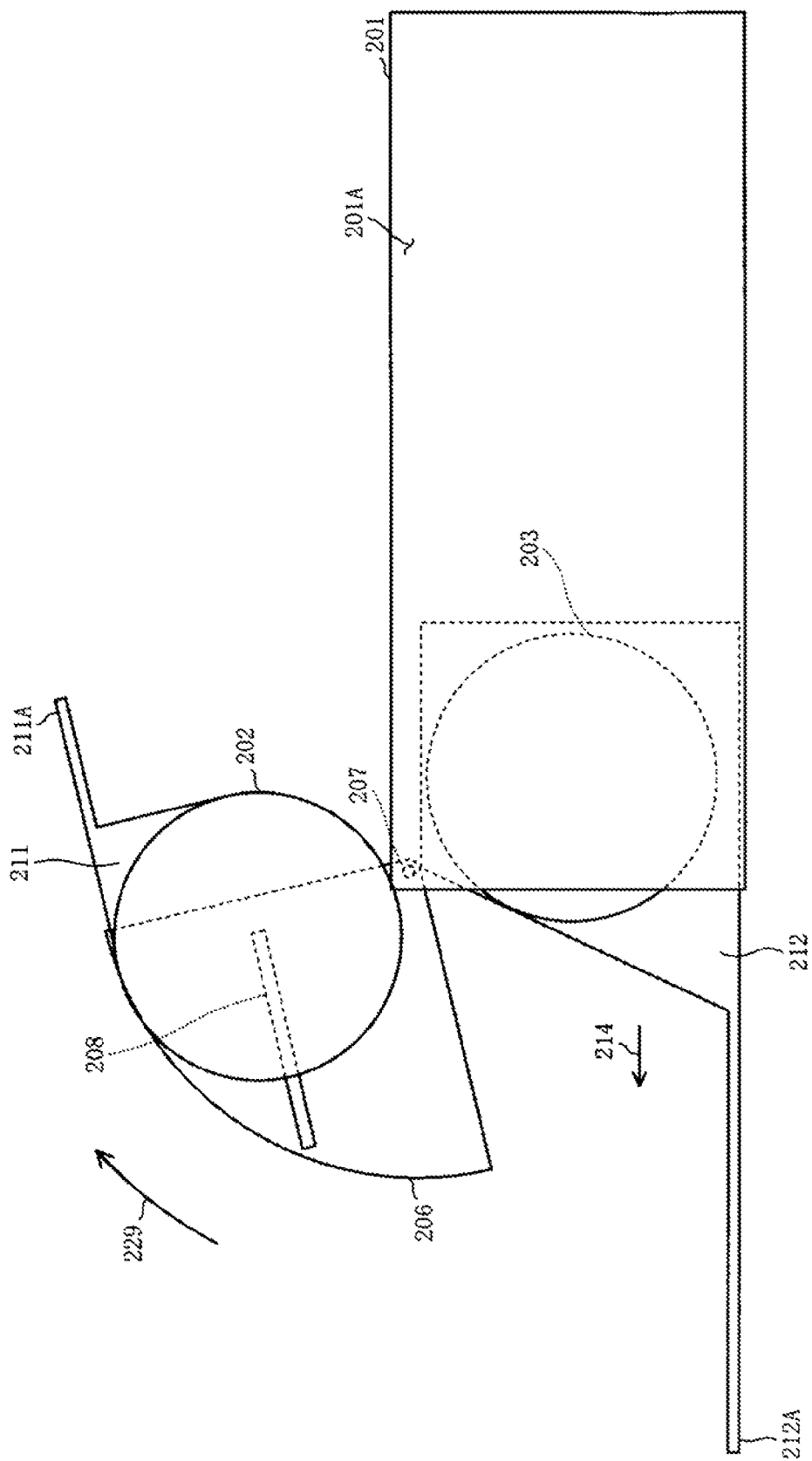
FIG. 8 is a side view of a main portion of the information processing apparatus with the second cooling fan holder moved further to the outside of the chassis from the position illustrated in FIG. 7.

FIG. 8 illustrates the second cooling fan holder 212 at a position moved further to the outside of the chassis 201 from the position illustrated in FIG. 7. FIG. 4 will also be referred to in the following description.

If the operator further pulls the second handle 212A in the direction of the arrow 214, this force is applied to the rotating plate 206 via the second cooling fan holder 212 and the first cooling fan holder 211. As a result, the rotating plate 206 starts to rotate around the rotating shaft 207 in the direction of an arrow 229 (clockwise).

As the rotating plate 206 is rotated, the slide rail 208 is tilted from a horizontal position. However, since the pair of pressing members 225 and 226 of the first cooling fan holder 211 sandwiches the circular plate 221B of the protrusion 221, the position of the protrusion 221 is secured to the rotating plate 206 by the magnet 228. Thus, the first cooling fan holder 211 fixed to the rotating plate 206 is rotated along with the rotating plate 206. Consequently, as the first cooling fan holder 211 moves to a position above the chassis 201, the opening portion 204 is gradually opened for discharge of the second cooling fan holder 212.

In FIG. 8, the shape of the second cooling fan holder 212 is simplified. Namely, in FIG. 8, slight movement of the second cooling fan holder 212 significantly rotates the opening portion 204. However, in practice, depending on the shape of the second cooling fan holder 212, the rotation angle of the first cooling fan holder 211 per movement amount of the second cooling fan holder 212 in the horizontal direction can be suitably adjusted. The same holds true for a second exemplary embodiment described below.

In this way, when the first cooling fan holder 211 is rotated by about 180 degrees from the rotation start position, a horizontally arranged end face (facing upward in FIG. 3) of the fan-shaped rotating plate 206 is moved to be approximately horizontal now with the end face downward. In this state, since the opening portion 204 illustrated in FIG. 3 is sufficiently opened in the direction of the arrow 214, the second cooling fan holder 212 can be extracted to the outside of the chassis 201 through the opening portion 204.

When the second cooling fan holder 212, which has been pressing the first cooling fan holder 211 from underneath, is extracted, the first cooling fan holder 211 starts to rotate along with the rotating plate 206 in the direction (now counterclockwise) opposite to the direction of the arrow 229 by the weight of the first cooling fan holder 211. Next, when the rotating plate 206 returns to the pre-rotation position illustrated in FIG. 3, the generated centrifugal force causes the protrusion 221 secured by the magnet 228 to be released from the attraction force. Subsequently, the first cooling fan holder 211 moves along the slide rail 208 in the direction opposite to the direction of the arrow 214 and automatically returns to the original position in the chassis 201.

If, for some reasons, the first cooling fan holder 211 stops before returning to the original position in the chassis 201, the operator simply needs to push the first cooling fan holder 211 with his/her hand. Alternatively, a spring or the like may be used so that, when the first cooling fan holder 211 rotates in the direction of the arrow 229, the spring stores force opposing the rotation. In this way, the stored force can be used to help the first cooling fan holder 211 to return to the original position.

Figure 9:
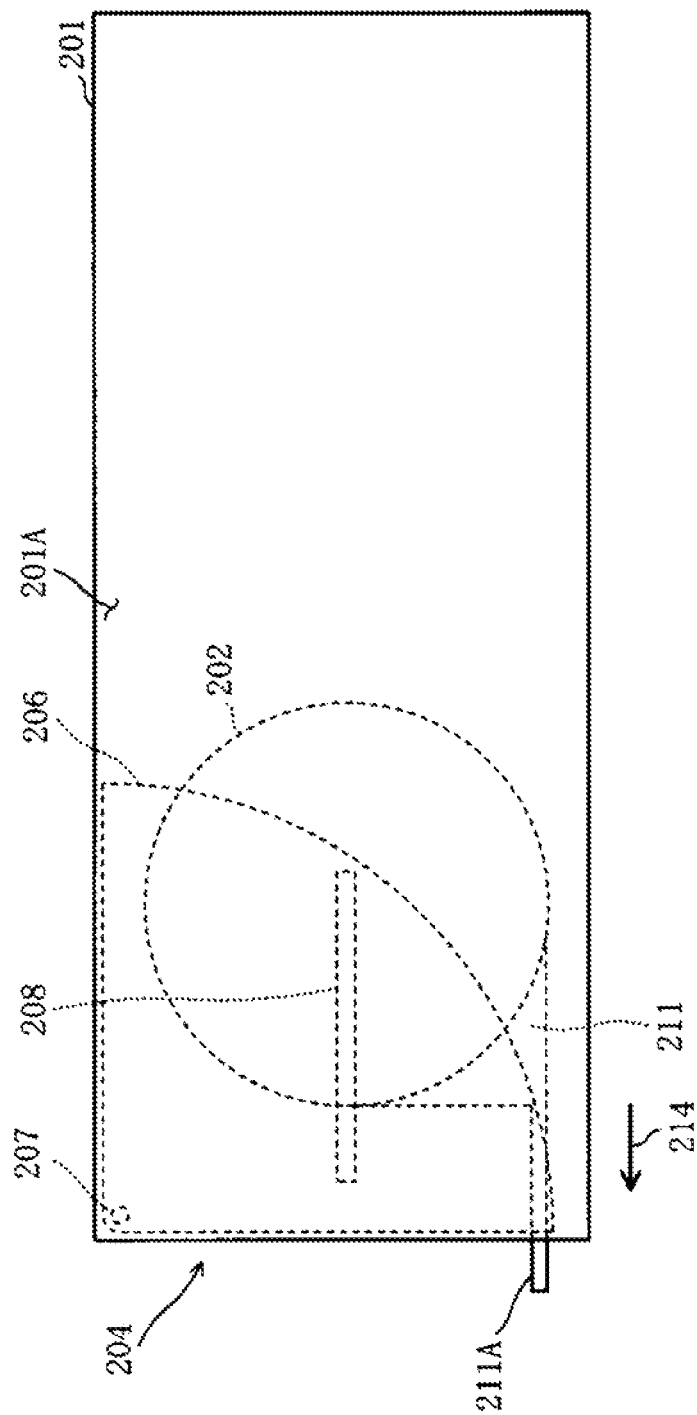
FIG. 9 is a side view of a main portion of the information processing apparatus according to the first exemplary embodiment with the first cooling fan holder accommodating a first cooling fan having been returned to the original position in the chassis.

FIG. 9 illustrates the first cooling fan holder 211 accommodating the first cooling fan 202 returned to the original position in the chassis 201. After the first cooling fan holder 211 and the first cooling fan 202 are extracted to the outside of the chassis 201 for a very short time, the first cooling fan 202 starts to cool the air in the chassis 201 again. Further, since the second cooling fan holder 212 remains in the chassis 201 until immediately before the first cooling fan holder 211 is extracted to the outside of the chassis 201, the second cooling fan 203 can continuously execute an air-cooling operation, unless the rotation thereof is completely stopped by a malfunction. Thus, an increase in the temperature in the chassis 201 from a time at which the first cooling fan holder 211 is started to be extracted to the outside of the chassis 201 to a time at which the first cooling fan holder 211 is returned to the original position is virtually negligible.

After completely extracting the second cooling fan holder 212 from the chassis 201, the operator changes the second cooling fan 203. After changing the second cooling fan 203, the operator pulls the first handle 211A in the direction of the arrow 214 to extract the first cooling fan holder 211 from the chassis 201. Next, the operator rotates the first cooling fan holder 211 in the direction of the arrow 229 by about 180 degrees, moves the first cooling fan holder 211 to a position above the chassis 201, and holds the first cooling fan holder 211 from underneath.

In this state, the operator slightly pushes the second cooling fan holder 212 into the chassis 201. Accordingly, the second cooling fan 203 resumes ventilation in the chassis 201. Next, the operator releases the first cooling fan holder 211 that has been held at the position above the chassis 201. Instantly, because of its own weight, the first cooling fan holder 211 starts to rotate in the direction opposite to the direction of the arrow 229 and pushes the second cooling fan holder 212 into the chassis 201. If necessary, the operator may push the first cooling fan holder 211 into the chassis 201 along the slide rail 208. In this way, both the first and second cooling fan holders 211 and 212 are returned to the respective original positions illustrated in FIG. 3. Then, the first cooling fan 202 also resumes a cooling operation in the chassis 201. Subsequently, by attaching the front panel 205 illustrated in FIG. 3, the operator completes changing the second cooling fan 203.

Of course, the operator may push the second cooling fan holder 212 through the opening portion 204 and return the second cooling fan holder 212 to the original position in the chassis 201, while holding the first cooling fan holder 211 at the position above the chassis 201. Subsequently, the operator may return the first cooling fan holder 211 to the original position. In this way, the time during which neither the first cooling fan holder 211 nor the second cooling fan holder 212 cools the air in the chassis 201 can also be virtually negligible.

Figure 14:
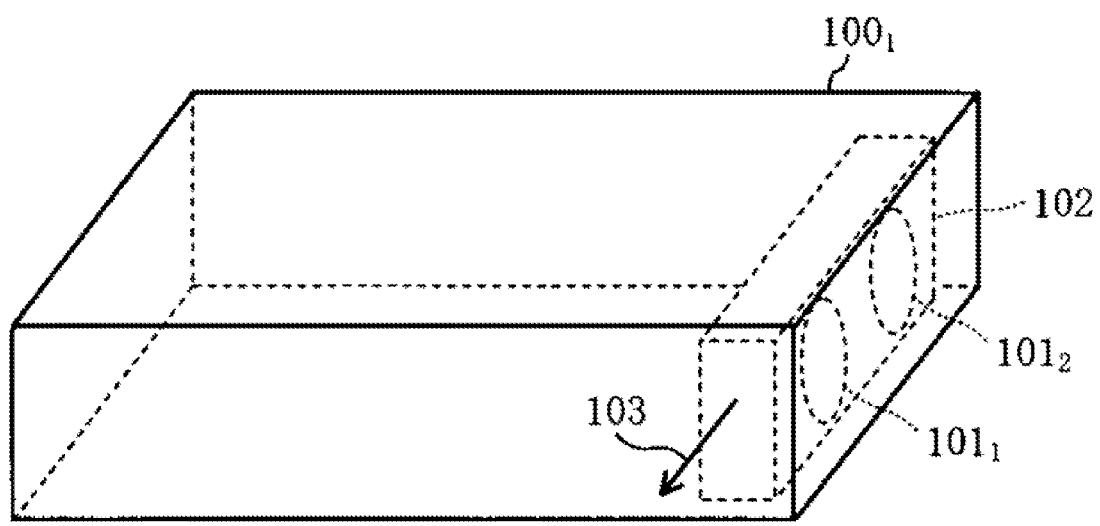
FIG. 14 is a perspective view of a main portion of an information processing apparatus adopting a redundant configuration of cooling fans according to a first related technique.
Figure 16:
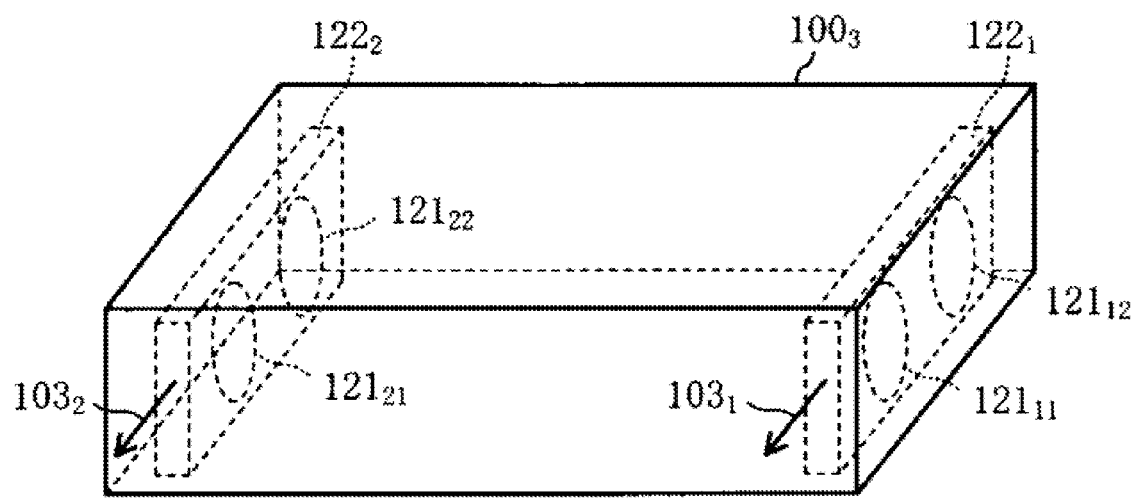
FIG. 16 is a perspective view of a main portion of an information processing apparatus adopting a redundant configuration of cooling fans according to a third related technique.

As described above, according to the first exemplary embodiment of the present disclosure, since the opening portion 204 of the information processing apparatus 200 illustrated in FIG. 3 is arranged in the front or back face of the chassis 201, the cooling fans 202 and 203 can be changed only through a desired one of the front and back faces. Namely, the advantage according to the first and third related techniques illustrated in FIGS. 14 and 16 is achieved, and the degree of installation freedom in the information processing apparatus 200 can be increased.

Figure 15:
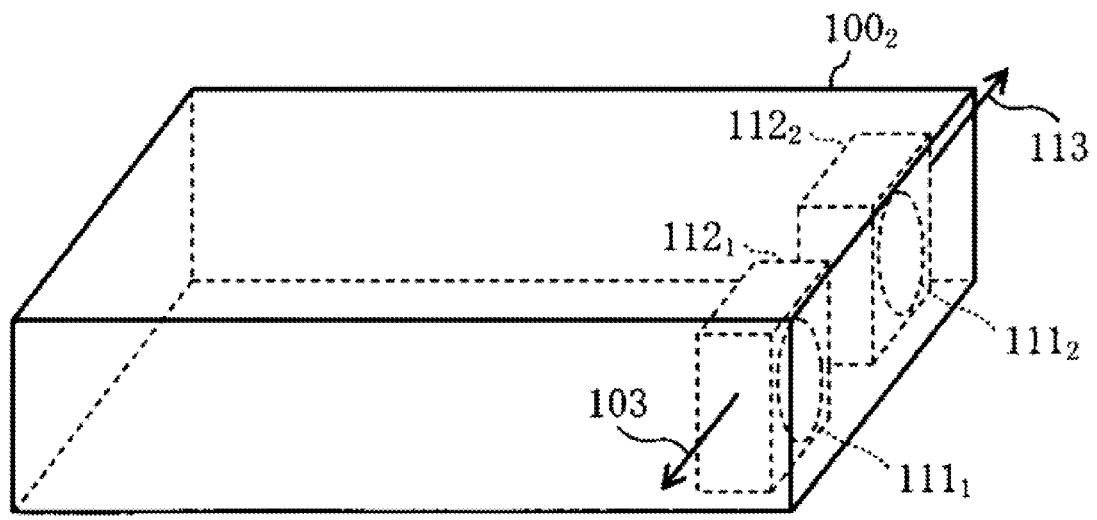
FIG. 15 is a perspective view of a main portion of an information processing apparatus adopting a redundant configuration of cooling fans according to a second related technique.

In addition, according to the present exemplary embodiment, when changing one of the cooling fans, the operator can allow the other cooling fan to remain in the apparatus and to continue an air-cooling operation. Thus, the present exemplary embodiment can also practically achieve the advantage according to the second related technique illustrated in FIG. 15. Needless to say, the present exemplary embodiment can solve the problems of an increase in the volume of the cooling fans and a decrease in cooling efficiency during a normal operation, while these problems are present in the third related technique illustrated in FIG. 16. In addition, since a simple mechanism is used in the present exemplary embodiment, shortened working time can practically suppress a slight cost increase that may be caused by addition of a mechanism.

Second Exemplary Embodiment

According to the above first exemplary embodiment, a single cooling fan holder accommodates a single cooling fan. However, according to the present disclosure, a single cooling fan holder may accommodate a plurality of cooling fans.

Figure 10:
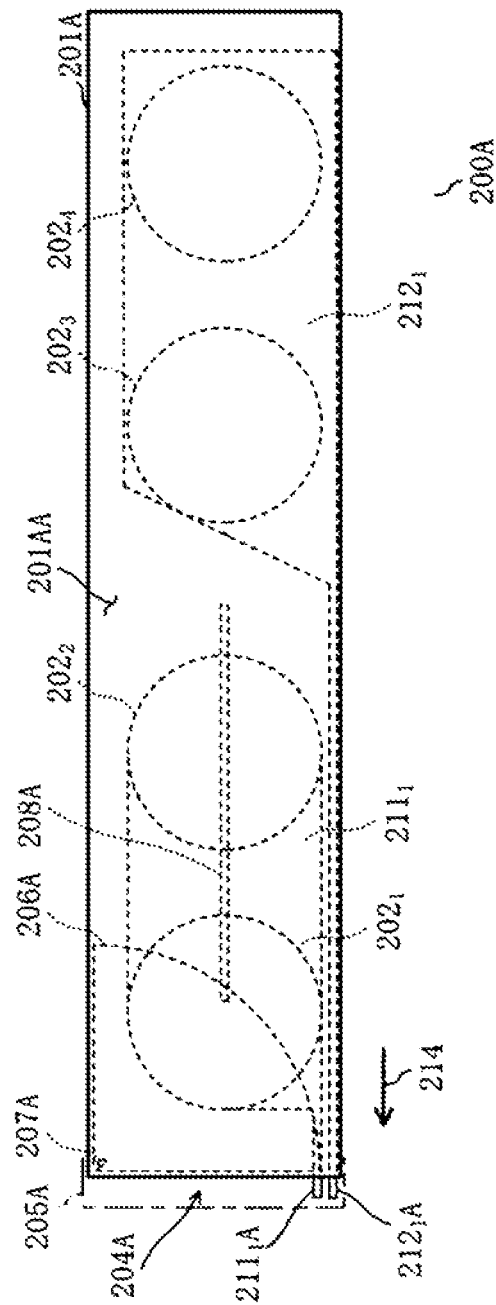
FIG. 10 is a side view of a main portion of an information processing apparatus including four cooling fans according a second exemplary embodiment of the present disclosure.

FIG. 10 illustrates an information processing apparatus 200A including four cooling fans according to a second exemplary embodiment of the present disclosure. In FIG. 10, the left end portion of a chassis 201A constituting the information processing apparatus 200A according to this second exemplary embodiment includes an opening portion 204A. A front panel 205A is removably attached to the opening portion 204A. The chassis 201A includes a side plate 201AA on the near side in FIG. 10, and a rotating plate 206A is arranged on the inner side of the side plate 201AA. The rotating plate 206A has the shape of a quadrant with a radius slightly shorter than the height of the opening portion 204A. The rotating plate 206A is rotatable around a rotating shaft 207A arranged at an upper corner of the side plate 201AA near the opening portion 204A. Normally, the rotating plate 206A is secured (locked) at the position illustrated in FIG. 10 by a locking mechanism (not illustrated).

First and second cooling fan holders $211_1$ and $212_1$ are arranged at respective predetermined positions in the chassis 201A. The transfer pathway of the second cooling fan holder $211_2$ in the chassis 201A includes the entire transfer pathway of the first cooling fan holder $211_1$. Simply put, the second cooling fan holder $212_1$ is arranged in the back of the transfer pathway of the first cooling fan holder $211_1$.

The first cooling fan holder $211_1$ holds first and second cooling fans $202_1$ and $202_2$. The second cooling fan holder $212_1$ holds third and fourth cooling fans $202_3$ and $202_4$. While a single slide rail 208A is present in the second exemplary embodiment, the slide rail 208A is not fixed to the rotating plate 206A but to the first cooling fan holder $211_1$. In addition, the slide rail 208A protrudes in the direction of the second cooling fan holder $211_2$ by a predetermined length from the position of the second cooling fan $202_2$.

While the slide rail 208A has the same cross-section structure as that of the slide rail 208 according to the first exemplary embodiment, both end portions of the slide rail 208A are open. Further, the protrusion 221 (see FIG. 5) fitted in the recess 222 (see FIG. 5) of the slide rail 208A is fixedly installed at a predetermined position of the rotating plate 206A, the predetermined position being on a line extending from the slide rail 208A. When the rotating plate 206A is positioned securely at the position illustrated in FIG. 10 by the locking mechanism, the slide rail 208A is arranged horizontally.

The first and second cooling fan holders $211_1$ and $212_1$ include first and second handles $211_1$A and $212_1$A, respectively. These handles $211_1$A and $212_1$A are used to extract the first and second cooling fan holders $211_1$ and $212_1$ through the opening portion 204A, respectively. An end portion of each of the first and second handles $211_1$A and $212_1$A slightly protrudes from the opening portion 204A. If the operator can extract the first and second cooling fan holders $211_1$ and $212_1$ to the outside of the chassis 201A by using a certain tool, the information processing apparatus 200A may not include the first and second handles $211_1$A and $212_1$A.

<Change of First Cooling Fan $202_1$ or Second Cooling Fan $202_2$>

When the first handle $211_1$A is pulled in the direction of the arrow 214 in FIG. 10, only the first cooling fan holder $211_1$ can be moved in the direction of the arrow 214, with the second cooling fan holder $212_1$ remaining stationary. The protrusion 221 (see FIG. 4) attached to the rotating plate 206A at the predetermined position is fitted into the slide rail 208A. Subsequently, the first cooling fan holder $211_1$ is moved along the slide rail 208A in the direction of the arrow 214 until stopped by a magnet (not illustrated) attached to the slide rail 208A near the right end portion thereof in FIG. 10. In this state, if the operator slightly strongly pulls the first handle $211_1$A in the direction of the arrow 214, the magnet attached to the slide rail 208A releases the attraction force with the protrusion 221 and moves with the first cooling fan holder $211_1$ in the direction of the arrow 214. In this way, the first cooling fan holder $211_1$ can be extracted to the outside of the information processing apparatus 200A.

During this change of the first cooling fan holder $211_1$, the second cooling fan holder $212_1$ remains at the original position in the chassis 201A. Thus, when the operator is changing the first cooling fan $202_1$ or the second cooling fan $202_2$ attached to the first cooling fan holder $211_1$, the third cooling fan $202_3$ and the fourth cooling fan $202_4$ can continue an air-cooling operation.

When the operator completes changing the first cooling fan $202_1$ or the second cooling fan $202_2$, it is only necessary that the operator insert the first cooling fan holder $211_1$ into the chassis 201A through the opening portion 204A and push the first cooling fan holder 211 in the direction opposite to the direction of the arrow 214.

When the first cooling fan holder $211_1$ is pushed, first, the slide rail 208A attached to the first cooling fan holder $211_1$ is loosely fitted with the protrusion 221 (see FIG. 4). Subsequently, the slide rail 208A is guided by the protrusion 221 and is moved in the direction opposite to the direction of the arrow 214. In this way, the first cooling fan holder $211_1$ is returned to the home position illustrated in FIG. 10.

When the first cooling fan holder $211_1$ is returned to the position illustrated in FIG. 10, a power supply cord connector (not illustrated) for driving the first and second cooling fans $202_1$ and $202_2$ is connected to a connector (not illustrated) on the information processing apparatus 200A side. Thus, as soon as the connection is established, rotation of the first and second cooling fans $202_1$ and $202_2$ is started.

Of course, the information processing apparatus 200A may be configured, so that when the first cooling fan holder $211_1$ is extracted to the outside of the information processing apparatus 200A, the power supply cord is extracted along with the first cooling fan holder $211_1$. In this way, after the connectors are connected and the rotation of the first cooling fan $202_1$ and the second cooling fan $202_2$ is started, the first cooling fan holder $211_1$ can be returned to the position illustrated in FIG. 10. Next, by attaching the front panel 205A illustrated in FIG. 10, the operator completes changing the first cooling fan $202_1$ or the second cooling fan $202_2$.

<Change of Third Cooling Fan $202_3$ or Fourth Cooling Fan $202_4$>

Next, change of the third cooling fan $202_3$ or the fourth cooling fan $202_4$ according to the second exemplary embodiment will be described. The operator can change the third cooling fan $202_3$ or the fourth cooling fan $202_4$ by simply pulling the second handle $212_1$A illustrated in FIG. 10 in the direction of the arrow 214 and extracting the second cooling fan holder $212_1$ from the chassis 201A. The change of the third cooling fan $202_3$ or the fourth cooling fan $202_4$ will be hereinafter described in detail.

Figure 11:
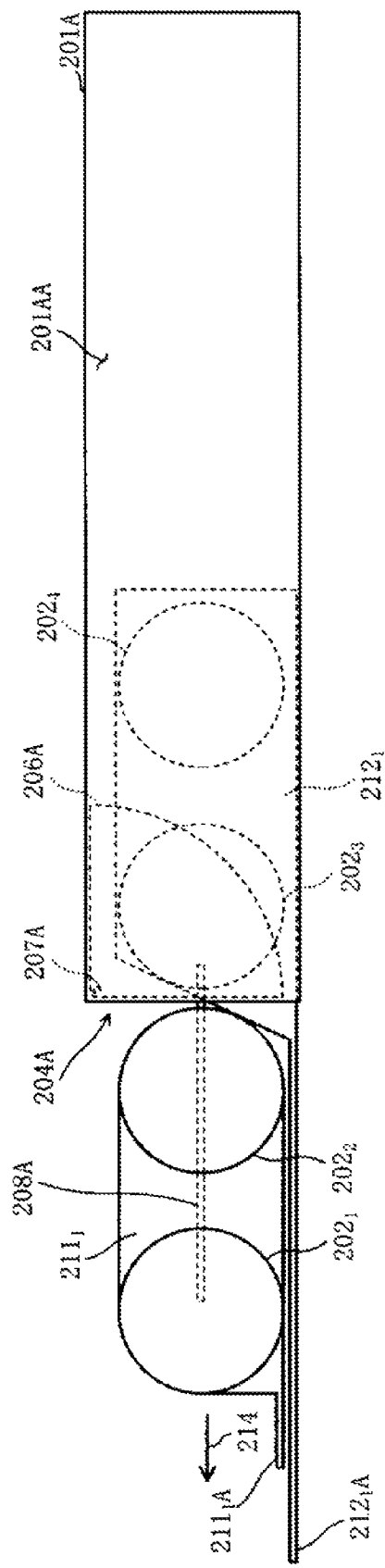
FIG. 11 is a side view of a main portion of the information processing apparatus with a second cooling fan holder partly extracted to the outside of the chassis from the position illustrated in FIG. 10.

FIG. 11 illustrates the second cooling fan holder $212_1$ slightly pulled toward the outside of the chassis 201A from the position illustrated in FIG. 10. If the operator pulls the second handle $212_1$A in the direction of the arrow 214, since the second cooling fan holder $212_1$ pushes the back of the first cooling fan holder $211_1$, the first cooling fan holder $211_1$ is also moved in the direction of the arrow 214. When the first cooling fan holder $211_1$ reaches a predetermined position, the slide rail 208A is fitted with the protrusion 221 (see FIG. 4). Along with the movement of the first cooling fan holder $211_1$, the protrusion 221 is moved from the left end to the right end of the slide rail 208A.

As described above, when the first cooling fan holder $211_1$ is moved to the position illustrated in FIG. 11, the protrusion 221 illustrated in FIG. 4 is moved to the left end position of the slide rail 208A. Accordingly, the protrusion 221 is fixed (attracted) by the magnet 228 (see FIG. 4). In this state, if the operator gently pulls the second handle $212_1$A in the direction of the arrow 214, the front-end portion of the second cooling fan holder $212_1$ pushes the rear-end portion of the first cooling fan holder $211_1$, with the positional relationship between the slide rail 208A and the protrusion 221 being maintained.

Figure 12:
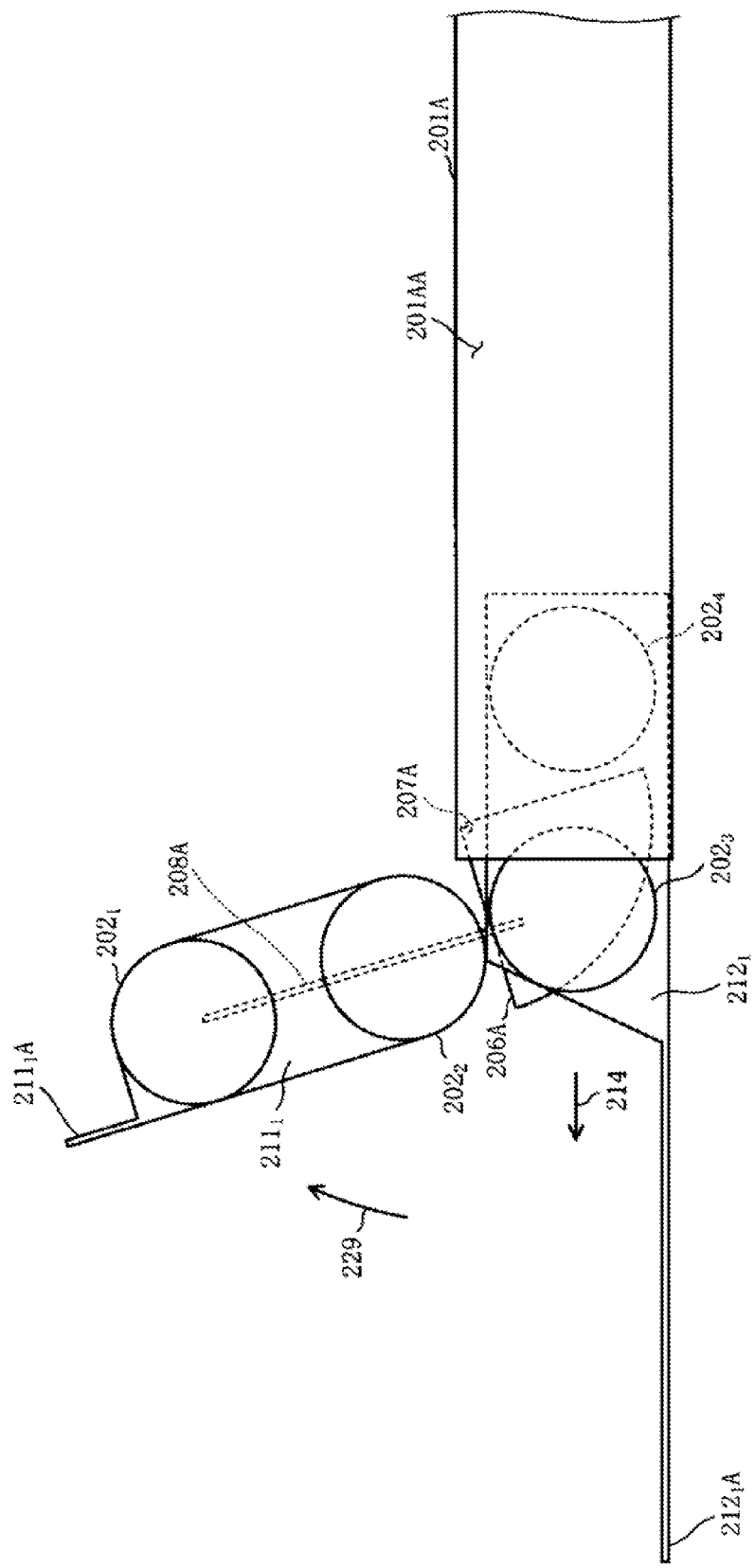
FIG. 12 is a side view of a main portion of the information processing apparatus with the second cooling fan holder moved further to the outside of the chassis from the position illustrated in FIG. 11.

FIG. 12 illustrates the second cooling fan holder $212_1$ moved further to the outside of the chassis 201A from the position illustrated in FIG. 11. FIG. 4 will also be referred to in the following description.

If the operator further pulls the second handle $212_1$A in the direction of the arrow 214, the front-end portion of the second cooling fan holder $212_1$ pushes a portion (not illustrated) of the first cooling fan holder $211_1$. As a result, the rotating plate 206A starts to rotate around the rotating shaft 207A in the direction of the arrow 229.

As the rotating plate 206A is rotated, along with the slide rail 208A secured to the rotating plate 206A, the first cooling fan holder $211_1$ is rotated. Consequently, as the first cooling fan holder $211_1$ moves to a position above the chassis 201A, the opening portion 204A (FIG. 10) is gradually opened for discharge of the second cooling fan holder $212_1$.

In this way, when the first cooling fan holder $211_1$ is rotated by about 90 degrees from the rotation start position, since the opening portion 204A illustrated in FIG. 10 is sufficiently opened in the direction of the arrow 214, the second cooling fan holder $212_1$ can be extracted to the outside of the chassis 201A through the opening portion 204A.

When the second cooling fan holder $212_1$, which has been pressing the first cooling fan holder $211_1$ from underneath, is extracted, the first cooling fan holder $211_1$ starts to rotate along with the rotating plate 206A in the direction opposite to the direction of the arrow 229 by the weight of the first cooling fan holder $211_1$. Next, when the rotating plate 206A returns to the pre-rotation position illustrated in FIG. 3, the generated centrifugal force causes the protrusion 221 fixed by the magnet 228 to be released from the attraction force. Subsequently, with the protrusion 221 moving along the slide rail 208A, the first cooling fan holder $211_1$ moves in the direction opposite to the direction of the arrow 214 and automatically returns to the original position in the chassis 201A.

If, for some reasons, the first cooling fan holder $211_1$ stops before returning to the original position in the chassis 201A, the operator simply needs to push the first cooling fan holder $211_1$ with his/her hand. Alternatively, a spring or the like may be used so that, when the first cooling fan holder $211_1$ rotates in the direction of the arrow 229, the spring stores force opposing the rotation. In this way, the stored force can be used to help the first cooling fan holder $211_1$ to return to the original position.

Figure 13:
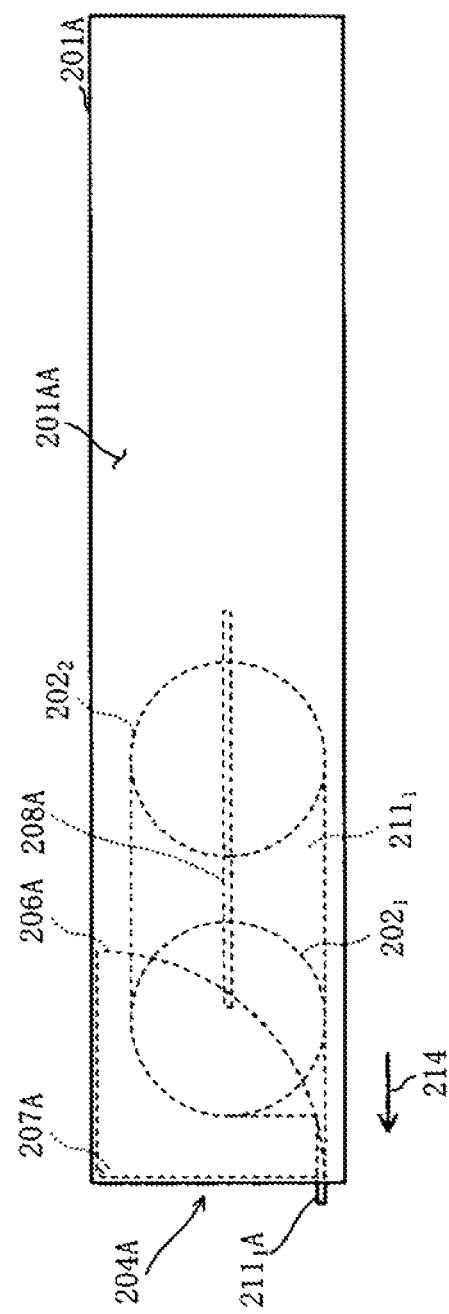
FIG. 13 is a side view of a main portion of the information processing apparatus according to the second exemplary embodiment with a first cooling fan holder accommodating first and second cooling fans having been returned to the original position in the chassis.

FIG. 13 illustrates the first cooling fan holder $211_1$ accommodating the first and second cooling fans $202_1$ and $202_2$ returned to the original position in the chassis 201A. After the first cooling fan holder $211_1$ and the first and second cooling fans $202_1$ and $202_2$ accommodated therein are extracted to the outside of the chassis 201A for a very short time, the first and second cooling fans $202_1$ and $202_2$ start to cool the air in the chassis 201A again. Further, since the second cooling fan holder $212_1$ remains in the chassis 201A until immediately before the first cooling fan holder $211_1$ is extracted to the outside of the chassis 201A, the third and fourth cooling fans $202_3$ and $202_4$ can continuously execute an air-cooling operation, unless the rotation thereof is completely stopped by a malfunction. Thus, an increase in the temperature in the chassis 201A from when the first cooling fan holder $211_1$ is started to be extracted to the outside of the chassis 201A to when the first cooling fan holder $211_1$ is returned to the original position is virtually negligible.

After completely extracting the second cooling fan holder $212_1$ from the chassis 201A, the operator changes the third cooling fan $202_3$ or the fourth cooling fan $202_4$. After changing the third cooling fan $202_3$ or the fourth cooling fan $202_4$, the operator pulls the first handle $211_1$A in the direction of the arrow 214 to extract the first cooling fan holder $211_1$ from the chassis 201A. Next, the operator rotates the first cooling fan holder $211_1$ in the direction of the arrow 229 by about 180 degrees, moves the first cooling fan holder $211_1$ to a position above the chassis 201A, and holds the first cooling fan holder $211_1$ from underneath.

In this state, the operator pushes the second cooling fan holder $212_1$ into the chassis 201A. Accordingly, the third and fourth cooling fans $202_3$ and $202_4$ resume ventilation in the chassis 201A. Next, the operator releases the first cooling fan holder $211_1$ that has been held at the position above the chassis 201A. Instantly, because of its own weight, the first cooling fan holder $211_1$ starts to rotate in the direction opposite to the direction of the arrow 229 and pushes the second cooling fan holder $212_1$ into the chassis 201A. If necessary, the operator may push the first cooling fan holder $211_1$ into the chassis 201A along the slide rail 208A. In this way, both the first and second cooling fan holders $211_1$ and $212_1$ are returned to the respective original positions illustrated in FIG. 10. Then, the first and second cooling fans $202_1$ and $202_2$ also resume a cooling operation in the chassis 201A. Subsequently, by attaching the front panel 205A illustrated in FIG. 10, the operator completes changing the third and fourth cooling fans $202_3$ and $202_4$.

Of course, the operator may push the second cooling fan holder $212_1$ through the opening portion 204A and return the second cooling fan holder $212_1$ to the original position in the chassis 201A, while holding the first cooling fan holder $211_1$ at the position above the chassis 201A. Subsequently, the operator may return the first cooling fan holder $211_1$ to the original position. In this way, the time during which neither the first cooling fan holder $211_1$ nor the second cooling fan holder $212_1$ cools the air in the chassis 201A can also be virtually negligible.

As described above, as in the first exemplary embodiment, according to the second exemplary embodiment of the present disclosure, even when a single cooling fan holder accommodates two cooling fans, during change of a cooling fan, the information processing apparatus can be cooled suitably. Thus, cooling fans can be changed even when the information processing apparatus is in operation.

While a single cooling fan holder accommodates two cooling fans in the second exemplary embodiment of the present disclosure, a single cooling fan holder may accommodate three or more cooling fans. Further, the cooling fan holders do not always need to be arranged in one side of the chassis. The cooling fan holders may be arranged in both sides of the chassis or in an inner side of the chassis.

Alternatively, for example, if a cooling fan holder holds a plurality of cooling fans and thus has a large length in the direction of movement, the length of the slide rail may be suitably adjusted. Further, by using a mechanism such as a spring, the slide rail may be provided with restoring force.

Of course, the rail can be omitted where the cooling fan holders move in parallel to the bottom part of the chassis. Namely, an arbitrary mechanism may be used, as long as, when the cooling fan holder, which has been accommodated on the near side of the opening portion, is moved close to the opening portion of the chassis, the cooling fan holder is held by a holding member at a predetermined position of the rotating plate and is moved away from the opening portion with the rotation of the rotating plate. Of course, when changing a cooling fan accommodated in the cooling fan holder accommodated on the near side of the opening portion, it is necessary that the cooling fan holder be released from the holding member and be moved to the outside of the chassis.

In addition, according to the first and second exemplary embodiments, the fan-shaped (quadrant) rotating plate is used. However, the present disclosure is not limited to such example. Namely, the rotating plate may have an arbitrary shape, as long as, when the second cooling fan holder is extracted to the outside of the chassis through the opening portion, the first cooling fan holder is extracted and no cooling fan accommodated in the first cooling fan holder inhibits the movement of the second cooling fan holder.

In addition, in the above first and second exemplary embodiments, FIGS. 4 and 5 illustrate specific configurations of the slide rail arranged on the rotating plate and the first cooling fan holder. However, various variations can be made to these configurations. For example, an electromagnet may be used to secure the rotating plate and the first cooling fan holder or a manual latch mechanism may be used for the rotating plate and the first cooling fan holder.

In addition, while change of cooling fans has been described in the first and second exemplary embodiments of the present disclosure, the present disclosure is also applicable to on-site inspection or simple repair. In addition, other than cooling fans, the present disclosure is also applicable to change, repair, maintenance, and inspection of other temperature adjustment electrical components such as a Peltier device and other electrical components.

Part or all of the above exemplary embodiments may be described as the following modes, though not limited thereto.

(Mode 1)

An information processing apparatus including:

a chassis being shaped into a rectangular parallelepiped having six faces of a top face, a bottom face, a first pair of opposing side faces, and a second pair of opposing side faces and including an opening portion in a certain one of the first pair of opposing side faces;

a first holder being arranged at a first accommodation position in the chassis and holding a predetermined electrical component that freely reciprocates on a first transfer pathway connecting the first accommodation position and the opening portion;

a second holder including the first transfer pathway in the chassis, being arranged at a second accommodation position farther than the first accommodation position from the opening portion, and holding a predetermined electrical component that freely reciprocates on a second transfer pathway connecting the second accommodation position and the opening portion;

a rotating member being rotatable around a certain point at an upper end portion of the opening portion in a plane parallel to a certain one of the second pair of opposing side faces from a first rotational position at which the entire rotating member is accommodated in the chassis to a second rotational position which the rotating member reaches when the rotating member is rotated by a certain angle of 90 degrees or more;

a first-holder/rotating-member fixing unit fixing the first holder to the rotating member remaining stationary at the first rotational position, when the first holder is moved from the first accommodation position to a predetermined position that the first holder reaches before completely passing through the opening portion; and a releasing unit releasing, under a predetermined condition, the first holder and the rotating member secured by the first-holder/rotating-member fixing unit.

(Mode 2)

The information processing apparatus according to mode 1, wherein the first-holder/rotating-member fixing unit includes:

a slide rail being arranged on the rotating member and in parallel to the first transfer pathway on which the first holder is moved;

a movable guide member being movably arranged on the slide rail;

a sandwiching unit being arranged on the first holder and sandwiching the movable guide member with a preset pressure; and a movable guide member fixing unit fixing the movable guide member when the movable guide member reaches a predetermined position of the slide rail.

(Mode 3)

The information processing apparatus according to mode 2, wherein the releasing unit releases the movable guide member when a pressure equal to or greater than the preset pressure is applied to the sandwiching unit.

(Mode 4)

The information processing apparatus according to mode 2, wherein the first-holder/rotating-member fixing unit comprises a magnet, and wherein, when the first holder is moved from the first accommodation position to a predetermined position that the first holder reaches before completely passing through the opening portion, the magnet fixes the movable guide member at the predetermined position.

(Mode 5)

The information processing apparatus according to mode 1, wherein a predetermined number of air-cooling fans each as the electrical component is held by the first and second holders.

(Mode 6)

The information processing apparatus according to mode 1, wherein a handle is attached to each of the first and second holders, and wherein the first and second holders are extracted to the outside through the opening portion with the respective handles.

(Mode 7)

An information processing apparatus holder operation method including:

"second holder pulling", i.e., pulling a second holder, not a first holder, toward an opening portion with a handle attached to the second holder, the first holder being arranged at a first accommodation position in a chassis that is shaped into a rectangular parallelepiped having six faces of a top face, a bottom face, a first pair of opposing side faces, and a second pair of opposing side faces and that includes the opening portion in a certain one of the first pair of opposing side faces, the first holder holding a predetermined electrical component that freely reciprocates on a first transfer pathway connecting the first accommodation position and the opening portion, and the second holder being arranged at a second accommodation position farther than the first accommodation position from the opening portion and holding a predetermined electrical component that freely reciprocates on a second transfer pathway connecting the second accommodation position and the opening portion;

"first-holder/rotating-member fixing", i.e., fixing the first holder to a rotating member remaining stationary at a first rotational position, when the second holder pushes the back of the first holder and moves toward the opening portion and when the first holder is moved from the first accommodation position to a predetermined position that the first holder reaches before completely passing through the opening portion in the second holder pulling, the rotating member being rotatable around a certain point at an upper end portion of the opening portion in a plane parallel to a certain one of the second pair of opposing side faces from the first rotational position at which the entire rotating member is accommodated in the chassis to a second rotational position which the rotating member reaches when the rotating member is rotated by a certain angle of 90 degrees or more;

"opening portion opening", i.e., continuously pulling the second holder toward the opening portion with the handle after the first holder is fixed to the rotating member in the first-holder/rotating-member fixing, allowing accordingly generated force to push the back of the first holder and to rotate the rotating member, allowing the first holder fixed to the rotating member to pass through the opening portion, allowing the first holder to rotationally move to a position above the chassis, and opening the opening portion;

"second holder discharge", i.e., continuously pulling the second holder with the handle, allowing the second holder to pass through the opening portion opened in the opening portion opening, and discharging the second holder to the outside of the chassis; and a first accommodation position return of allowing the weight of the first holder to rotate the first holder in a direction opposite to the direction in which the rotating member is rotated and moving the first holder toward the first accommodation position, after the second holder is discharged to the outside of the chassis in the second holder discharge and the force pressing the back of the first holder is eliminated.

(Mode 8)

The information processing apparatus holder operation method according to mode 7, further including:

releasing the first holder from the rotating member when the first holder reaches the predetermined position in the first accommodation position return.

(Mode 9)

The information processing apparatus holder operation method according to mode 7, including:

"first holder pulling", i.e., pulling a first holder, to an opening portion with a handle attached to the first holder, the first holder being arranged at a first accommodation position in a chassis that is shaped into a rectangular parallelepiped having six faces of a top face, a bottom face, a first pair of opposing side faces, and a second pair of opposing side faces and that includes the opening portion in a certain one of the first pair of opposing side faces and freely reciprocating on a first transfer pathway connecting the first accommodation position and the opening portion and the second holder being arranged at a second accommodation position farther than the first accommodation position from the opening portion, and freely reciprocating on a second transfer pathway connecting the second accommodation position and the opening portion.

(Mode 10)

The information processing apparatus holder operation method according to mode 7, wherein a predetermined number of air-cooling fans are accommodated in each of the first and second holders, and wherein the air-cooling fans are at least electrically connected in the chassis.

As described above, the present disclosure is suitable when a holder accommodates a cooling fan(s), though not limited thereto. For example, the present disclosure is also applicable to an information processing apparatus including a holder holding various types of electrical components and to an information processing apparatus holder operation method. It should be noted that other objects, features and aspects of the present disclosure will become apparent in the entire disclosure and that modifications may be done without departing the gist and scope of the present disclosure as disclosed herein and claimed as appended herewith.

Also it should be noted that any combination or selection of the disclosed and/or claimed elements, matters and/or items may fall under the modifications aforementioned.

What is claimed is:

1. An information processing apparatus comprising:
   a chassis being shaped into a rectangular parallelepiped having six faces of a top face, a bottom face, a first pair of opposing side faces, and a second pair of opposing side faces and including an opening portion in a certain one of the first pair of opposing side faces;
   a first holder being arranged at a first accommodation position in the chassis and holding a predetermined electrical component that freely reciprocates on a first transfer pathway connecting the first accommodation position and the opening portion;
   a second holder including the first transfer pathway in the chassis, being arranged at a second accommodation position farther than the first accommodation position from the opening portion, and holding a predetermined electrical component that freely reciprocates on a second transfer pathway connecting the second accommodation position and the opening portion;
   a rotating member being rotatable around a certain point at an upper end portion of the opening portion in a plane parallel to a certain one of the second pair of opposing side faces from a first rotational position at which the entire rotating member is accommodated in the chassis to a second rotational position which the rotating member reaches when the rotating member is rotated by a certain angle of 90 degrees or more;
   a first-holder/rotating-member fixing unit fixing the first holder to the rotating member remaining stationary at the first rotational position, when the first holder is moved from the first accommodation position to a predetermined position that the first holder reaches before completely passing through the opening portion; and
   a releasing unit releasing, under a predetermined condition, the first holder and the rotating member secured by the first-holder/rotating-member fixing unit.

2. The information processing apparatus according to claim 1,
   wherein said first-holder/rotating-member fixing unit comprises:
   a slide rail being arranged on the rotating member and in parallel to the first transfer pathway on which the first holder is moved;
   a movable guide member being movably arranged on the slide rail;
   a sandwiching unit being arranged on the first holder and sandwiching the movable guide member with a preset pressure; and
   a movable guide member fixing unit fixing the movable guide member when the movable guide member reaches a predetermined position of the slide rail.

3. The information processing apparatus according to claim 2,
   wherein the releasing unit releases the movable guide member when a pressure equal to or greater than the preset pressure is applied to the sandwiching unit.

4. The information processing apparatus according to claim 2,
   wherein the first-holder/rotating-member fixing unit comprises a magnet, and
   wherein, when the first holder is moved from the first accommodation position to a predetermined position that the first holder reaches before completely passing through the opening portion, the magnet fixes the movable guide member at the predetermined position.

5. The information processing apparatus according to claim 1,
   wherein a predetermined number of air-cooling fans each as the electrical component is held by the first and second holders.

6. The information processing apparatus according to claim 1,
   wherein a handle is attached to each of the first and second holders, and
   wherein the first and second holders are extracted to the outside through the opening portion with the respective handles.

7. An information processing apparatus holder operation method comprising:

"second holder pulling", i.e., pulling a second holder, not a first holder, toward an opening portion with a handle attached to the second holder, the first holder being arranged at a first accommodation position in a chassis that is shaped into a rectangular parallelepiped having six faces of a top face, a bottom face, a first pair of opposing side faces, and a second pair of opposing side faces and that includes the opening portion in a certain one of the first pair of opposing side faces, the first holder holding a predetermined electrical component that freely reciprocates on a first transfer pathway connecting the first accommodation position and the opening portion, and the second holder being arranged at a second accommodation position farther than the first accommodation position from the opening portion and holding a predetermined electrical component that freely reciprocates on a second transfer pathway connecting the second accommodation position and the opening portion;

"first-holder/rotating-member fixing", i.e., fixing the first holder to a rotating member remaining stationary at a first rotational position, when the second holder pushes the back of the first holder and moves toward the opening portion and when the first holder is moved from the first accommodation position to a predetermined position that the first holder reaches before completely passing through the opening portion in said second holder pulling, the rotating member being rotatable around a certain point at an upper end portion of the opening portion in a plane parallel to a certain one of the second pair of opposing side faces from the first rotational position at which the entire rotating member is accommodated in the chassis to a second rotational position which the rotating member reaches when the rotating member is rotated by a certain angle of 90 degrees or more;

"opening portion opening", i.e., continuously pulling the second holder toward the opening portion with the handle after the first holder is secured to the rotating member in the first-holder/rotating-member fixing, allowing accordingly generated force to push the back of the first holder and to rotate the rotating member, allowing the first holder fixed to the rotating member to pass through the opening portion, allowing the first holder to rotationally move to a position above the chassis, and opening the opening portion;

"second holder discharge", i.e., continuously pulling the second holder with the handle, allowing the second holder to pass through the opening portion opened in said opening portion opening, and discharging the second holder to the outside of the chassis; and "first accommodation position return", i.e., allowing the weight of the first holder to rotate the first holder in a direction opposite to the direction in which the rotating member is rotated and moving the first holder toward the first accommodation position, after the second holder is discharged to the outside of the chassis in the second holder discharge and the force pressing the back of the first holder is eliminated.

8. The information processing apparatus holder operation method according to claim 7, further comprising:

releasing the first holder from the rotating member when the first holder reaches the predetermined position in the first accommodation position return.

9. The information processing apparatus holder operation method according to claim 7, comprising:

"first holder pulling", i.e., pulling a first holder, to an opening portion with a handle attached to the first holder, the first holder being arranged at a first accommodation position in a chassis that is shaped into a rectangular parallelepiped having six faces of a top face, a bottom face, a first pair of opposing side faces, and a second pair of opposing side faces and that includes the opening portion in a certain one of the first pair of opposing side faces and freely reciprocating on a first transfer pathway connecting the first accommodation position and the opening portion and the second holder being arranged at a second accommodation position farther than the first accommodation position from the opening portion, and freely reciprocating on a second transfer pathway connecting the second accommodation position and the opening portion.

10. The information processing apparatus holder operation method according to claim 7, wherein a predetermined number of air-cooling fan(s) is (are) accommodated in each of the first and second holders, and wherein the air-cooling fans are at least electrically connected in the chassis.

* * * * *